US012622012B2

(12) United States Patent
Chen et al.

(10) Patent No.: US 12,622,012 B2
(45) Date of Patent: May 5, 2026

(54) **NORMALLY-OFF *p*-GaN GATE DOUBLE CHANNEL HEMT AND THE MANUFACTURING METHOD THEREOF**

(71) Applicant: The Hong Kong University of Science and Technology, Hong Kong (CN)

(72) Inventors: Jing Chen, Hong Kong (CN); Hang Liao, Hong Kong (CN); Zheyang Zheng, Hong Kong (CN); Tao Chen, Hong Kong (CN)

(73) Assignee: The Hong Kong University of Science and Technology, Hong Kong (CN)

( * ) Notice: Subject to any disclaimer, the term of this patent is extended or adjusted under 35 U.S.C. 154(b) by 370 days.

(21) Appl. No.: 18/315,543

(22) Filed: May 11, 2023

(65) Prior Publication Data

US 2023/0411507 A1    Dec. 21, 2023

Related U.S. Application Data

(60) Provisional application No. 63/352,234, filed on Jun. 15, 2022.

(51) Int. Cl.
 *H10D 30/47* (2025.01)
 *H10D 30/01* (2025.01)
 (Continued)

(52) U.S. Cl.
 CPC ......... *H10D 30/475* (2025.01); *H10D 30/015* (2025.01); *H10D 30/6738* (2025.01);
 (Continued)

(58) Field of Classification Search
 CPC ............... H10D 30/475; H10D 30/015; H10D 30/6738; H10D 30/675; H10D 62/85;
 (Continued)

(56) References Cited

U.S. PATENT DOCUMENTS 6,992,319 B2 * 1/2006 Fahimulla .............. B82Y 10/00
                                              257/E29.05
10,411,125 B2 * 9/2019 Teo ...................... H10D 30/475
                     (Continued)

FOREIGN PATENT DOCUMENTS

CN        101378074 A  *  3/2009  ........... H03F 1/0288
CN        101789446 A     7/2010
                     (Continued)

OTHER PUBLICATIONS

K. J. Chen, O. Haberlen, A. Lidow, C. lin Tsai, T. Ueda, Y. Uemoto, and Y. Wu, "GaN-on-Si Power Technology: Devices and Applications," IEEE Transactions on Electron Devices, vol. 64, No. 3, 779-795, Mar. 2017, doi: 10.1109/TED.2017.2657579.
                     (Continued)

*Primary Examiner* — Mohammed Shamsuzzaman
(74) *Attorney, Agent, or Firm* — S&F/WEHRW

(57) ABSTRACT

A high electron mobility transistor (HEMT) device including a substrate and a semiconductor stack is provided. The semiconductor stack comprises a lower channel layer, an insertion layer (ISL) positioned above the lower channel layer for confining electrons in the lower channel layer, an upper channel layer, an interface enhancement layer (IEL) positioned above the upper channel layer for confining the electrons in the upper channel layer, and a barrier layer positioned above the IEL. The ISL and the IEL are formed above the lower channel layer and the upper channel layer respectively to create a first and second wide bandgap heterojunction. The ISL and the IEL each provides a higher energy band with a potential barrier with respect to the electrons generated between the ISL and the lower channel layer, and between the IEL and the upper channel layer. The potential barrier prevents or reduces a flow of hot electrons.

19 Claims, 15 Drawing Sheets

100

(51) Int. Cl.

| | |
|---|---|
| *H10D 30/67* | (2025.01) |
| *H10D 62/85* | (2025.01) |
| *H10D 64/01* | (2025.01) |
| *H10D 64/64* | (2025.01) |
| *H10W 74/10* | (2026.01) |

(52) U.S. Cl.
CPC .......... *H10D 30/675* (2025.01); *H10D 62/85* (2025.01); *H10D 62/8503* (2025.01); *H10D 64/01* (2025.01); *H10D 64/64* (2025.01); *H10W 74/137* (2026.01); *H10W 74/147* (2026.01)

(58) Field of Classification Search
CPC .... H10D 62/8503; H10D 64/01; H10D 64/64; H10D 30/4732; H10D 62/343; H01L 23/3171; H01L 23/3192
See application file for complete search history.

(56) References Cited

U.S. PATENT DOCUMENTS

| | | | | |
|---|---|---|---|---|
| 10,505,032 B2 * | 12/2019 | Chen | ...................... | H10D 84/82 |
| 10,580,879 B2 * | 3/2020 | Wang | ................ | H01L 21/02507 |
| 11,705,511 B2 * | 7/2023 | Chen | .................... | H10D 30/015 |
| | | | | 257/194 |
| 2002/0167023 A1 * | 11/2002 | Chavarkar | ......... | H10D 30/4732 |
| | | | | 257/192 |
| 2002/0185655 A1 * | 12/2002 | Fahimulla | .............. | B82Y 10/00 |
| | | | | 257/E29.05 |
| 2005/0077538 A1 * | 4/2005 | Heikman | ............. | H10D 30/015 |
| | | | | 257/E21.407 |
| 2006/0244010 A1 * | 11/2006 | Saxler | ................ | H10D 30/4732 |
| | | | | 257/E29.091 |
| 2008/0296618 A1 * | 12/2008 | Suh | ...................... | H10D 62/343 |
| | | | | 257/190 |
| 2009/0218599 A1 * | 9/2009 | Mishra | ............... | H10D 30/4732 |
| | | | | 257/E29.246 |
| 2014/0266324 A1 | 9/2014 | Teo et al. | | |
| 2017/0271492 A1 * | 9/2017 | Chiu | .................... | H10D 62/824 |

FOREIGN PATENT DOCUMENTS

| | | | | | | |
|---|---|---|---|---|---|---|
| CN | 101916773 | B | | 5/2012 | | |
| CN | 106449737 | B | * | 6/2019 | ............. | H01L 21/28 |
| CN | 113270494 | A | * | 8/2021 | ......... | H10D 30/4732 |
| CN | 114038907 | A | * | 2/2022 | ......... | H10D 30/473 |
| CN | 114497207 | A | * | 5/2022 | .......... | H10D 62/824 |
| CN | 115020491 | A | * | 9/2022 | .......... | H10D 30/015 |
| JP | 2006245317 | A | * | 9/2006 | ........ | H10D 30/4755 |
| WO | WO-2018032601 | A1 | * | 2/2018 | ............. | H10D 30/47 |
| WO | WO-2018087728 | A1 | * | 5/2018 | .......... | H10D 64/256 |

OTHER PUBLICATIONS

J. A. del Alamo and E. S. Lee, "Stability and Reliability of Lateral GaN Power Field-Effect Transistors," IEEE Transactions on Electron Devices, vol. 66, No. 11, pp. 4578-4590, Nov. 2019, doi:10.1109/TED.2019.2931718.

I. Rossetto, M. Meneghini, A. Tajalli, S. Dalcanale, C. D. Santi, P. Moens, A. Banerjee, E. Zanoni, and G. Meneghesso, "Evidence of Hot-Electron Effects During Hard Switching of AlGaN/GaN HEMTs," IEEE Transactions on Electron Devices, vol. 64, No. 9, pp. 3734-3739, Sep. 2017, doi: 10.1109/TED.2017.2728785.

C. Hu, "Lucky-electron model of channel hot electron emission," in 1979 International Electron Devices Meeting, 1979, pp. 22-25, doi: 10.1109/IEDM.1979.189529.

N. Modolo, C. De Santi, A. Minetto, L. Sayadi, S. Sicre, G. Prechtl, G. Meneghesso, E. Zanoni, and M. Meneghini, "A Physics-Based Approach to Model Hot-Electron Trapping Kinetics in p-GaN HEMTs," IEEE Electron Device Letters, vol. 42, No. 5, pp. 673-676, May 2021, doi: 10.1109/LED.2021.3067796.

M. Meneghini, N. Ronchi, A. Stocco, G. Meneghesso, Umesh. K. Mishra, Y. Pei, and E. Zanoni, "Investigation of Trapping and Hot-Electron Effects in GaN HEMTs by Means of a Combined Electrooptical Method," IEEE Transactions on Electron Devices, vol. 58, No. 9, pp. 2996-3003, Sep. 2011, doi: 10.1109/TED.2011.2160547.

M. J. Uren, S. Karboyan, I. Chatterjee, A. Pooth, P. Moens, A. Banerjee, and M. Kuball, "'Leaky Dielectric' Model for the Suppression of Dynamic RON in Carbon-Doped AlGaN/GaN HEMTs," IEEE Transactions on Electron Devices, vol. 64, No. 7, pp. 2826-2834, Jul. 2017, doi: 10.1109/TED.2017.2706090.

A. Sozza, C. Dua, E. Morvan, M. A. diForte-Poisson, S. Delage, F. Rampazzo, A. Tazzoli, F. Danesin, G. Meneghesso, E. Zanoni, A. Curutchet, N. Malbert, N. Labat, B. Grimbert, and J.-C. D Jaeger, "Evidence of traps creation in GaN/AlGaN/GaN HEMTs after a 3000 hour on-state and off-state hot-electron stress," in IEEE InternationalElectron Devices Meeting, 2005. IEDM Technical Digest., 2005, p. 4 pp. -593, doi: 10.1109/IEDM.2005.1609416.

M. Ruzzarin, M. Meneghini, I. Rossetto, M. Van Hove, S. Stoffels, T.-L. Wu, S. Decoutere, G. Meneghesso, and E. Zanoni, "Evidence of Hot-Electron Degradation in GaN-Based MIS-HEMTs Submitted to High Temperature Constant Source Current Stress," IEEE Electron Device Letters, vol. 37, No. 11, pp. 1415-1417, Nov. 2016, doi: 10.1109/LED.2016.2609098.

S. Yang, Z. Zheng, L. Zhang, W. Song, and K. J. Chen, "GaN MIS-HEMTs with Surface Reinforcement for Suppressed Hot-Electron-Induced Degradation," IEEE Electron Device Letters, pp. 1-1, 2021, doi: 10.1109/LED.2021.3057933.

R. Chu et.al., AlGaN—GaN double-channel HEMTs, IEEE Transactions on Electron Devices, vol. 52, No. 4, pp. 438-446, Apr. 2005, doi: 10.1109/TED.2005.844791.

J.Liu et. al., Highly linear A10.3Ga0.7N—A10.05Ga0.95N—GaN composite-channel HEMTs, IEEE Electron device Letters, vol. 26, No. 3, pp. 145-147, Mar. 2005, doi: 10.1109/LED.2005.843218.

J. Wei et. al., Low On-Resistance Normally-Off GaN Double-Channel Metal-Oxide-Semiconductor High-Electron-Mobility Transistor, IEEE Transactions on Electron Devices, vol. 36, No. 12, pp. 1287-1290, Dec. 2015.

T. Palacios et. al., Use of double-channel heterostructures to improve the access resistance and linearity in GaN-based HEMTs, IEEE Transactions on Electron Devices, vol. 53, No. 3, pp. 562-565, Mar. 2006, doi: 10.1109/TED.2005.863767.

J Wei et. al., Enhancement-mode GaN double-channel MOS-HEMT with low on-resistance and robust gate recess, in 2015 IEEE International Electron Devices Meeting (IEDM), 2015, p. 9.4.1-9.4.4, doi: 10.1109/IEDM.2015.7409662.

* cited by examiner

100

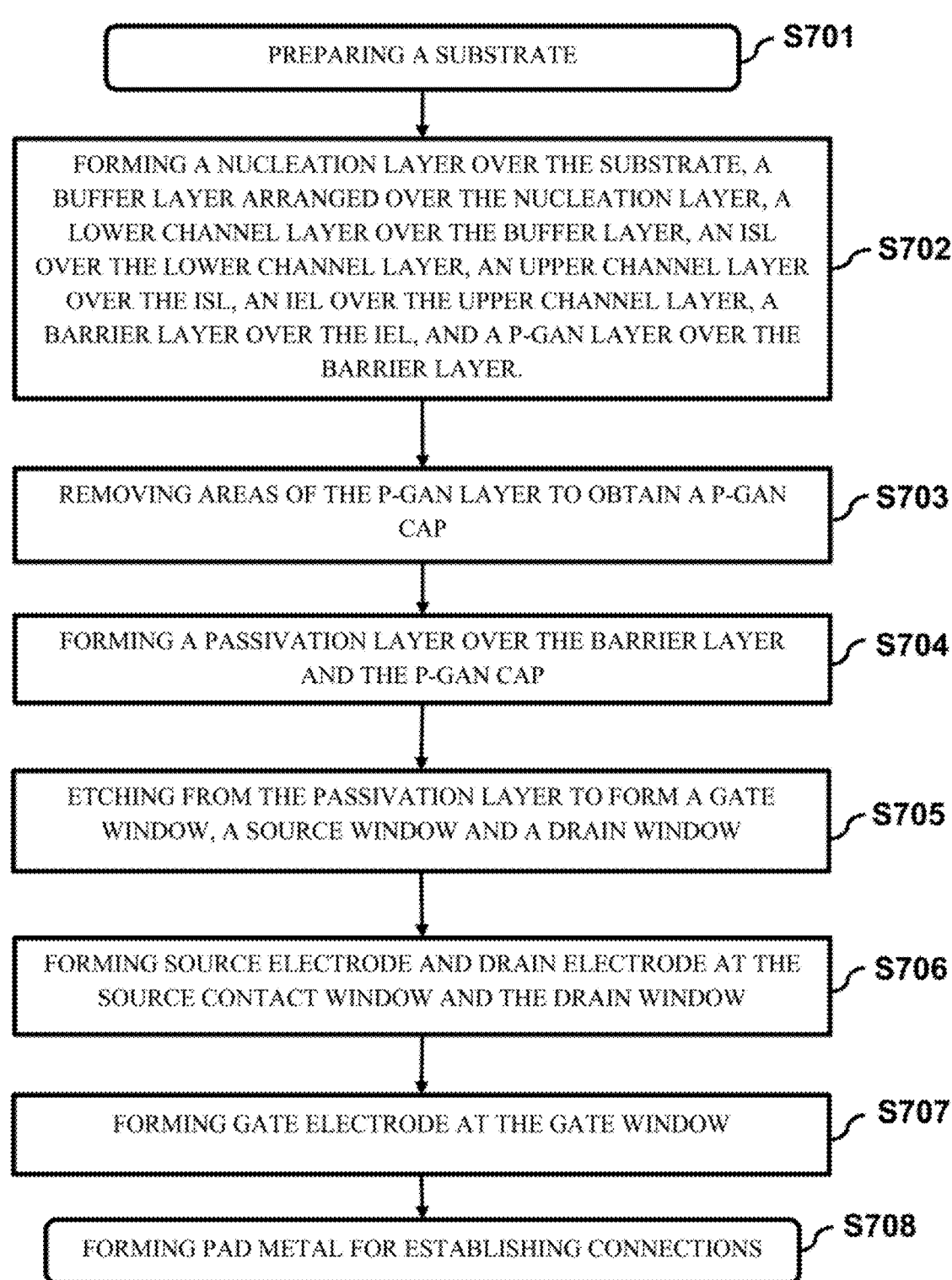

PREPARING A SUBSTRATE ⟋ S701

FORMING A NUCLEATION LAYER OVER THE SUBSTRATE, A BUFFER LAYER ARRANGED OVER THE NUCLEATION LAYER, A LOWER CHANNEL LAYER OVER THE BUFFER LAYER, AN ISL OVER THE LOWER CHANNEL LAYER, AN UPPER CHANNEL LAYER OVER THE ISL, AN IEL OVER THE UPPER CHANNEL LAYER, A BARRIER LAYER OVER THE IEL, AND A P-GAN LAYER OVER THE BARRIER LAYER. ⟋ S702

REMOVING AREAS OF THE P-GAN LAYER TO OBTAIN A P-GAN CAP ⟋ S703

FORMING A PASSIVATION LAYER OVER THE BARRIER LAYER AND THE P-GAN CAP ⟋ S704

ETCHING FROM THE PASSIVATION LAYER TO FORM A GATE WINDOW, A SOURCE WINDOW AND A DRAIN WINDOW ⟋ S705

FORMING SOURCE ELECTRODE AND DRAIN ELECTRODE AT THE SOURCE CONTACT WINDOW AND THE DRAIN WINDOW ⟋ S706

FORMING GATE ELECTRODE AT THE GATE WINDOW ⟋ S707

FORMING PAD METAL FOR ESTABLISHING CONNECTIONS ⟋ S708

FIG. 7

NORMALLY-OFF p-GaN GATE DOUBLE CHANNEL HEMT AND THE MANUFACTURING METHOD THEREOF

CROSS REFERENCE TO RELATED APPLICATIONS

This application claims the benefit of U.S. Provisional Patent Application No. 63/352,234 filed on Jun. 15, 2022, the disclosure of which is incorporated by reference herein in its entirety.

FIELD OF THE INVENTION

The present disclosure generally relates to a semiconductor device. In particular, the present disclosure relates to a normally-off p-gallium nitride (p-GaN) gate double channel high electron mobility transistor (HEMT) and the manufacturing method thereof.

BACKGROUND OF THE INVENTION

Gallium nitride (GaN) based high-electron-mobility transistors (HEMTs) have gained significant attention in recent years due to their power handling capabilities and superior performance characteristics, such as high switching speed and favorable trade-off between specific on-resistance and breakdown voltage. These properties make GaN HEMTs suitable for a wide range of applications, including switch-mode power converters, LiDARs, and high-frequency power amplifiers. However, the reliability and longevity of these devices are inevitably challenged by hot electrons induced dynamic on-resistance (Ro N) degradation, which results from the simultaneous stress of high electric fields and current densities during operation.

Referring to FIG. 1A, a p-GaN single channel HEMT is illustrated. This structure is the main-stream commercialized structure with a Silicon (Si) substrate 10, a GaN buffer layer 20, an aluminum nitride (AlN) barrier 41, an aluminium gallium nitride (AlGaN) barrier layer 40, a dielectric passivation layer 54, a source electrode 51, a gate electrode 52 with a p-GaN layer 55, and a drain electrode 53. With the wide bandgap heterostructure at the GaN buffer layer 20 interfacing with the AlN barrier 41, the device has a two-dimensional electron gas (2 DEG) channel 30 with a high electron mobility. Hot electrons are generated in the 2 DEG channel 30 when the device is hard-switched ($V_{GS}$>$V_{TH}$) and features a high drain-source voltage (e.g., 50 V for the device), resulting in elastic scattering of hot electrons. These scattered hot electrons 45 can be redirected toward the critical yet vulnerable interface between the dielectric passivation layer 54 and the AlGaN barrier layer 40 due to high electric fields [1]. Particularly, upon reaching such interface, hot electrons may be captured by pre-existing empty interface traps [2], leading to partial depletion 31 of the 2 DEG channel 30 in the access region and a consequent increase in dynamic $R_{ON}$. The above-described partial depletion 31 is demonstrated in FIG. 1B.

Furthermore, the kinetic energy released by hot electrons may result in bombardment of the vulnerable interface region, potentially creating new defects that end up as additional interface traps. These traps are electrically active and can capture electrons but take a long time to release them, leading to further deterioration or degradation of the dynamic $R_{ON}$ [3], when the device is subjected to long-term hot electron stress.

Conventionally, a surface reinforcement layer (SRL) 46, such as a crystalline (Al)GaON layer, can be deposited over the critical interface between the dielectric passivation layer 54 and the AlGaN barrier layer 40 to prevent damage from the hot electrons [4], as shown in FIG. 2A. The SRL 46 provides an energy barrier to block the hot electrons and physically strengthens the interface to avoid formation of interface traps. This can enhance the reliability of the p-GaN HEMTs under hot electron stress conditions.

Alternatively, with reference to FIG. 2B, there are some other approaches to tackle the hot-electron induced dynamic $R_{ON}$ degradation issue: 1) by suppressing the generation of hot electrons at the 2 DEG channel 30 or 2) by deterring the generated hot electrons from reaching the critical interface between the dielectric passivation layer 54 and the AlGaN barrier layer 40. The first approach can be realized by employing a field plate, but it requires delicate design to maximize its benefits and to minimize side effects.

Accordingly, there is a need in the art for a high-performance GaN HEMT that can effectively suppress hot electron induced dynamic on-resistance degradation. Such a structure would improve the reliability and longevity of the GaN HEMT devices, and enhance their overall performance and market competitiveness. Furthermore, other desirable features and characteristics will become apparent from the subsequent detailed description and the appended claims, taken in conjunction with the accompanying drawings and this background of the disclosure.

SUMMARY OF THE INVENTION

Provided herein is a normally-off p-GaN gate double channel HEMT device and the method for fabricating the same. It is the objective of the present disclosure to provide a HEMT device that can effectively suppress hot electron induced dynamic on-resistance degradation by deterring generated hot electrons from reaching the critical passivation/AlGaN interface.

In the first aspect of the present disclosure, there is provided a HEMT device including a substrate and a semiconductor stack formed on the substrate. The semiconductor stack includes a lower channel layer, an insertion layer (ISL) positioned above the lower channel layer for confining electrons in the lower channel layer, an upper channel layer, an interface enhancement layer (IEL) positioned above the upper channel layer for confining the electrons in the upper channel layer, and a barrier layer positioned above the IEL. The ISL is formed above the lower channel layer to create a first wide bandgap heterojunction between the lower channel layer and the ISL. The IEL is formed above the upper channel layer to create a second wide bandgap heterojunction between the upper channel layer and the IEL. The ISL and the IEL each provides a higher energy band with a potential barrier with respect to the electrons generated between the ISL and the lower channel layer, and between the IEL and the upper channel layer. The potential barrier prevents or reduces a flow of hot electrons moving from the lower channel layer to the barrier layer.

In an embodiment, the lower channel layer is selected from the group consisting GaN, InN, and their alloys; and the ISL is a layer of binary III-N compounds (AlN), ternary III-N compounds (AlGaN, InAlN, InGaN), or quaternary III-N compounds (InAlGaN).

In an embodiment, the upper channel layer is selected from the group consisting GaN, InN, and their alloys; and the IEL is a layer of binary III-N compounds (AlN), ternary III-N compounds (AlGaN, InAlN, InGaN), or quaternary III-N compounds (InAlGaN).

In an embodiment, the barrier layer is a layer of binary III-N compounds (AlN), ternary III-N compounds (AlGaN, InAlN, InGaN), or quaternary III-N compounds (InAlGaN).

In an embodiment, the semiconductor stack further includes a p-type cap above the barrier layer for realizing a normally-off operation, wherein the p-type cap is a layer of binary III-N compounds (AlN, GaN, InN), ternary III-N compounds (AlGaN, InAlN, InGaN), or quaternary III-N compounds (InAlGaN).

In one embodiment, the p-type cap is a p-GaN cap; and the p-type cap is provided without a recess-etching into the barrier layer such that the HEMT device has a planar top p-GaN gate with a pristine upper channel layer.

In an embodiment, a plurality of ohmic contacts are deposited above the barrier layer to form at least a source electrode and a drain electrode. A gate electrode is deposited on the p-type cap.

In one embodiment, a passivation layer is provided above the barrier layer separating the source electrode, the gate electrode, and the drain electrode, wherein the passivation layer is a single layer or a stack of layers selected from AlN/SiN$_x$, AlN/SiO$_2$, and SiN$_x$/SiO$_2$.

In one embodiment, the upper channel layer forms a conductive channel for the HEMT device by providing a path for the electrons to flow from the source electrode to the drain electrode with a detour in electron trajectories from the upper channel layer to the lower channel layer, then back to the upper channel layer.

In an embodiment, the semiconductor stack further includes a nucleation layer and a buffer layer. The nucleation layer reduces a lattice mismatch between the substrate and the buffer layer; and the buffer layer isolates the nucleation layer from the lower channel layer.

In an embodiment, the nucleation layer is an III-N nucleation layer selected from the group consisting AlN, GaN, InN, and their alloys.

In an embodiment, the buffer layer is an III-N semiconductor layer selected from the group consisting AlN, GaN, InN, and their alloys.

In the second aspect of the present disclosure, there is provided a method for fabricating a p-GaN gate double channel HEMT device having a double channel structure. The method includes preparing a substrate of silicon, sapphire, diamond, silicon carbide (SiC), aluminum nitride (AlN) or gallium nitride (GaN); forming a semiconductor stack comprising a nucleation layer, a buffer layer, a lower channel layer, an insertion layer (ISL), an upper channel layer, an interface enhancement layer (IEL), and a barrier layer by depositing the nucleation layer, the buffer layer, the lower channel layer, the ISL, the upper channel layer, the IEL, and the barrier layer sequentially above the substrate; forming a p-type layer on the barrier layer by metal-organic chemical vapor deposition (MOCVD), molecular beam epitaxy (MBE), or hydride vapour phase epitaxy (HVPE); removing areas of the p-type layer to obtain a p-type cap by plasma dry etching, digital etching, or a combination thereof; depositing a passivation layer at the top of the barrier layer and the p-type cap; performing etching from the passivation layer at regions within the p-type cap to create a gate window, and at two opposing sides of the barrier layer to create a source window and a drain window; and depositing a plurality of ohmic contacts at the source window, the drain window, and the gate window to form a source electrode and a drain electrode on the barrier layer, and a gate electrode on the p-type cap.

In an embodiment, the ISL, the IEL, and the barrier layer are fabricated using AlN, wherein the AlN is formed by MOCVD, MBE, HVPE, plasma-enhanced atomic layer deposition (PEALD) or thermal atomic layer deposition (TALD).

In an embodiment, the passivation layer is formed by performing plasma-enhanced chemical vapor deposition (PECVD) or low-pressure chemical vapor deposition (LPCVD).

In an embodiment, the step of forming the semiconductor stack further comprises performing deposition by MOCVD, MBE, or HVPE.

In an embodiment, the method further includes the step of forming pad metals for establishing connections to the source electrode, the gate electrode, and the drain electrode.

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter. Other aspects and advantages of the present invention are disclosed as illustrated by the embodiments hereinafter.

BRIEF DESCRIPTION OF THE DRAWINGS

The appended drawings contain figures to further illustrate and clarify the above and other aspects, advantages, and features of the present disclosure. It will be appreciated that these drawings depict only certain embodiments of the present disclosure and are not intended to limit its scope. It will also be appreciated that these drawings are illustrated for simplicity and clarity and have not necessarily been depicted to scale. The present disclosure will now be described and explained with additional specificity and detail through the use of the accompanying drawings in which:

FIG. 7 is a flow diagram summarizing an exemplary fabrication process of the p-GaN gate double channel HEMT, in accordance with certain embodiments of the present disclosure;

DETAILED DESCRIPTION OF THE INVENTION

Figure 1A:
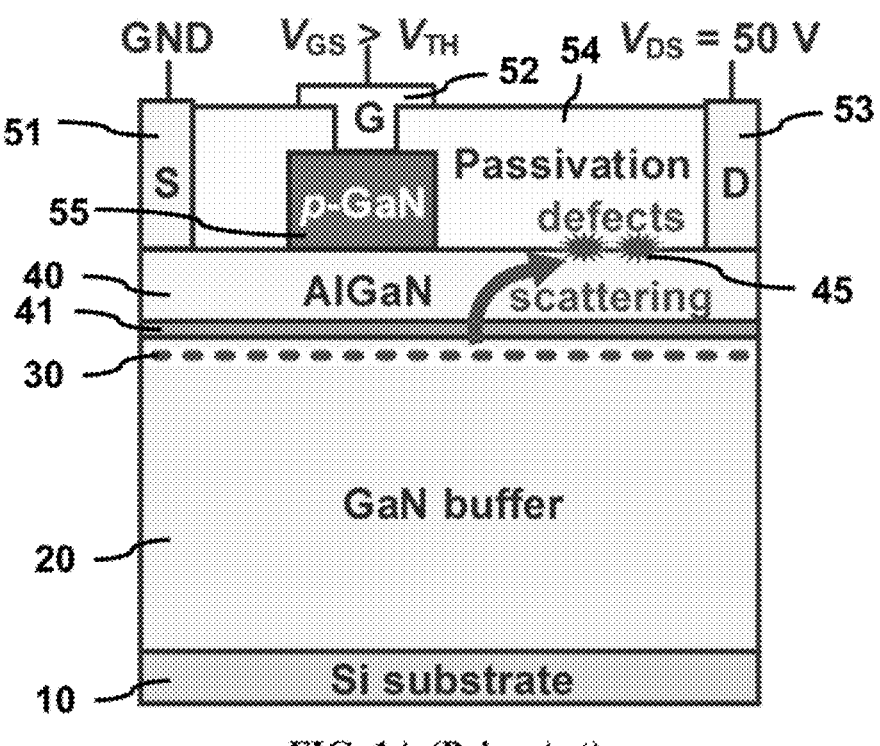
FIG. 1A is a cross-sectional view of a conventional p-GaN single channel HEMT with elastic scattering of hot electrons.
Figure 1B:
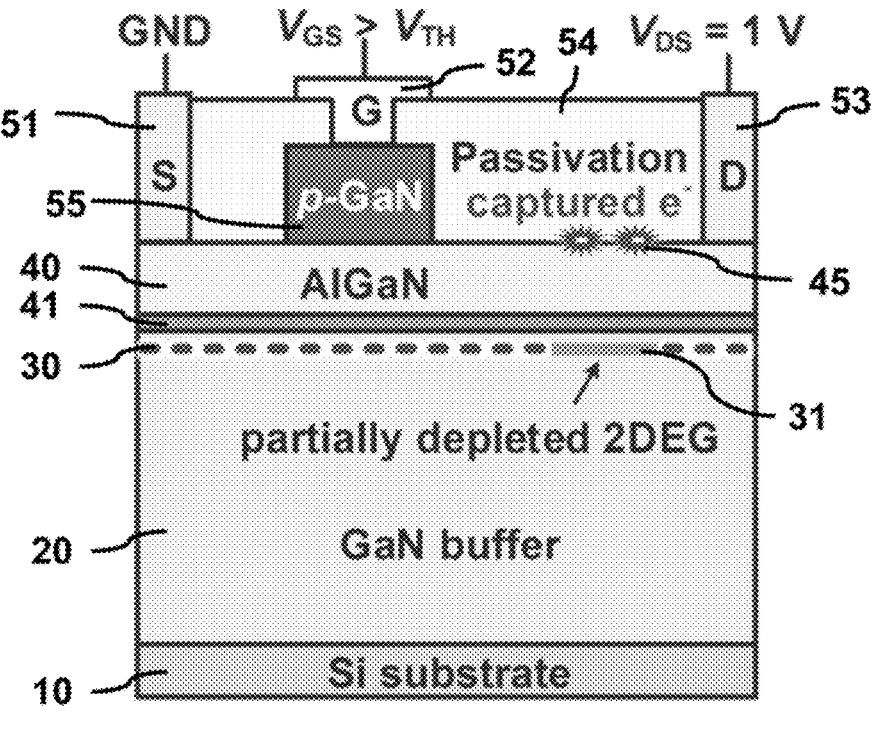
FIG. 1B is a cross-sectional view of a conventional p-GaN single channel HEMT with a partially depleted 2 DEG channel.
Figure 2A:
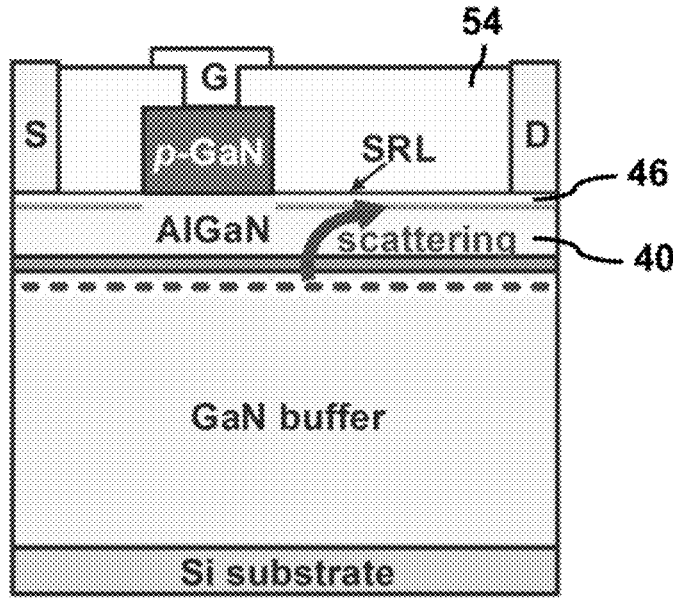
FIG. 2A shows the first conventional approach of using a SRL to prevent damage from the hot electrons.
Figure 2B:
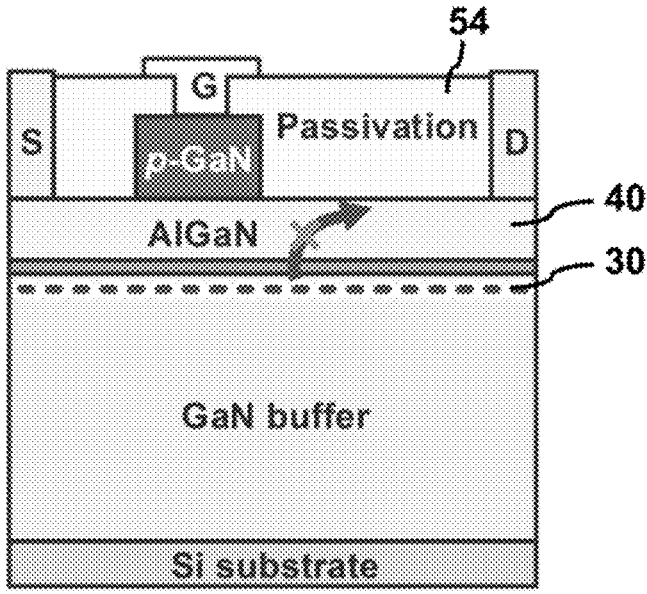
FIG. 2B shows the second conventional approach of suppressing the formation of hot electrons and deterring the hot electrons from reaching the critical interface.

The present disclosure generally relates to a double channel structure in gallium nitride (GaN) for suppressing hot electrons induced dynamic on-resistance (Ro N) degradation. As one embodiment, a normally-off p-GaN gate double channel high-electron-mobility transistor (HEMT) is provided. It is one of the objectives of the present disclosure to provide a structure that would improve the reliability and longevity of the GaN HEMT devices, and enhance their overall performance and market competitiveness.

The benefits, advantages, solutions to problems and any element(s) that may cause any benefit, advantage, or solution to occur or become more pronounced are not to be construed as critical, required, or essential features or elements of any or all of the claims. The invention is defined solely by the appended claims including any amendments made during the pendency of this application and all equivalents of those claims as issued.

In the claims which follow and in the preceding description of the invention, except where the context requires otherwise due to express language or necessary implication, the word "comprise" or variations such as "comprises" or "comprising" is used in an inclusive sense, i.e., to specify the presence of the stated features but not to preclude the presence or addition of further features in various embodiments of the invention.

As used herein and in the claims, the term "connect" refers to electrical connection either directly or indirectly via one or more electrical means unless otherwise stated. The values recited herein are exemplary, and are not intended to limit the present invention to a particular configuration or set of values, but only indicate one possible set of values, unless otherwise indicated herein.

As used herein throughout the specification, notations N+, N, P+, and P indicate relative levels of impurity concentration in each conductivity type. That is, N+ indicates an N-type impurity concentration higher than that of N, and P+ indicates a P-type impurity concentration higher than that of P. For simplicity and clarity, an N+ type is sometimes referred to as an N-type, and a P+ type is sometimes referred to as a P-type.

As used herein, the terms "above", "below", "topside", "backside", and the like describe the relative vertical position of the layers or regions to each other, which encompasses the orientations depending on the spatial orientation of the semiconductor device. Generally, a first layer being above a second layer refers to the position of the first layer that is further away from the substrate layer vertically.

Various embodiments disclosed herein provide a structure and/or a fabrication method (e.g., manufacturing method) for an improved semiconductor device that has a double channel structure. In a preferred embodiment, the semiconductor is made of group III-N compound semiconductor, such as GaN, aluminum nitride (AlN), indium nitride (InN), etc. The group III-N semiconductor has the advantage of wide bandgap, high electric breakdown field, and high thermal conductivity. It is apparent that the various features of the improved semiconductor device can be applied to other heterostructures without departing from the scope and spirit of the present disclosure.

By way of introduction, the present disclosure provides a normally-off p-GaN gate double channel HEMT device for improving the reliability issues induced by the hot electrons. The HEMT device uses a heterostructure, i.e. a junction between two materials with different bandgaps, instead of local doping to provide mobile electrons in a channel. The HEMT device can advantageously enable a normally-off (enhancement mode) operation, whose channel current is zero when a gate voltage is zero, which is more appropriate for use in power electronics or high-speed digital circuits. The double channel structure of the present disclosure provides an additional heterojunction interface in the channel for achieving an improved reliability. Methods for fabricating such normally-off p-GaN gate double channel HEMT are also provided.

Figure 3:
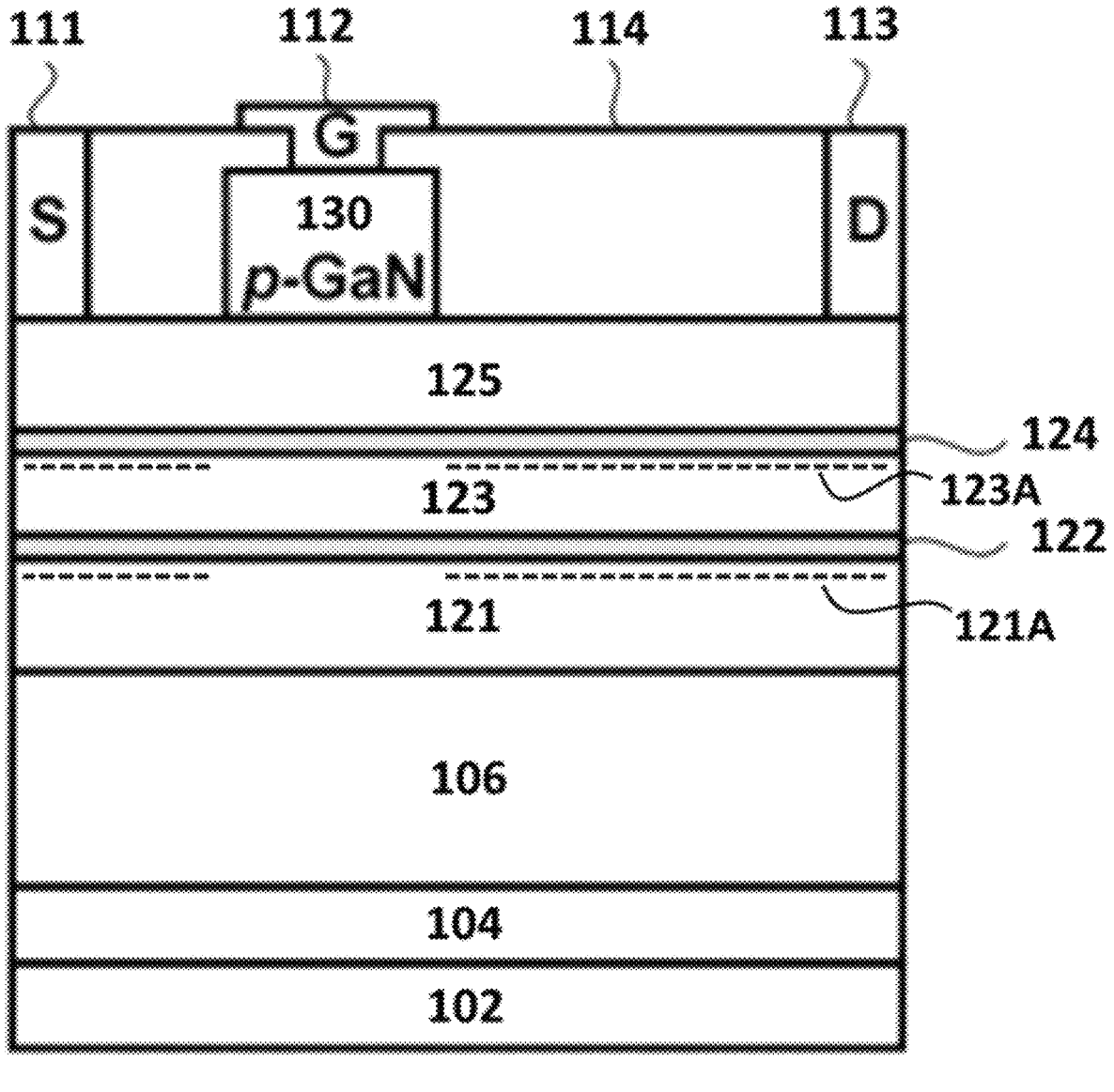
FIG. 3 is a cross-sectional view of the p-GaN gate double channel HEMT, in accordance with certain embodiments of the present disclosure.

FIG. 3 shows a normally-off double channel HEMT device 100 in accordance with one or more embodiments of the present disclosure. The HEMT device 100 comprises a substrate 102 and a semiconductor stack formed on the substrate 102, wherein the semiconductor stack is an III-N semiconductor stack comprising a nucleation layer 104, a buffer layer 106, a lower channel layer 121, an insertion layer (ISL) 122, an upper channel layer 123, an interface enhancement layer (IEL) 124, a barrier layer 125, and a p-type cap 130 (such as a p-GaN cap) which are arranged and implemented in a vertical structure. In certain embodiments, a plurality of ohmic contacts are deposited above the barrier layer 125 to form at least a source (S) electrode 111 and a drain (D) electrode 113. A gate (G) electrode 112 is then deposited on the p-type cap 130.

In certain embodiments, the substrate 102 can comprise one or more substrate layers, which may include but not limited to, silicon (Si), sapphire, diamond, silicon carbide (SiC), AlN, GaN, or the like. The substrate 102 is selected based on desired properties, such as thermal conductivity, dielectric strength, and cost. The use of AlN or GaN provides good thermal conductivity and high dielectric breakdown but at a higher cost. Sapphire or SiC provide an inexpensive alternative. In certain embodiments, the thickness of the substrate 102 is approximately 1 mm.

The nucleation layer 104 is formed on and positioned above the substrate 102. In certain embodiments, the nucleation layer 104 is an III-N nucleation layer selected from the group consisting AlN, GaN, InN, and their alloys (such as AlGaN and InGaN). The nucleation layer 104 promotes the growth of the subsequent layers and helps reduce the lattice mismatch between the substrate 102 and the buffer layer 106. In certain embodiments, the thickness of the nucleation layer 104 ranges 1 μm to 3 μm. As an example, the thickness of the nucleation layer 104 is 2.7 μm.

The buffer layer 106 is formed on and positioned above the nucleation layer 104. In certain embodiments, the buffer layer 106 is an III-N semiconductor layer selected from the group consisting AlN, GaN, InN, and their alloys. The buffer layer 106 could be the same as the nucleation layer 104 or it could be different from the nucleation layer 104. For instance, the buffer layer 106 and the nucleation layer 104 may both comprise GaN, or the buffer layer 106 may comprise AlGaN whereas the nucleation layer 104 may comprise GaN. The buffer layer 106 isolates the nucleation layer 104 from the lower channel layer 121 and helps to reduce defects and stress in the subsequent layers. In certain embodiments, the thickness of the buffer layer 106 ranges 1 μm to 2 μm. As an example, the thickness of the buffer layer 106 is 1.6 μm.

The lower channel layer 121 is formed on and positioned above the buffer layer 106. The lower channel layer 121 forms a conductive channel for the HEMT device 100 by providing a path for electrons to flow from the source electrode 111 to the drain electrode 113. In certain embodiments, the lower channel layer 121 is selected from the group consisting GaN, InN, and their alloys. In certain embodiments, the thickness of the lower channel layer 121 ranges 100 nm to 500 nm. As an example, the thickness of the lower channel layer 121 is 240 nm.

The ISL 122 is formed and positioned between the lower channel layer 121 and the upper channel layer 123. The ISL 122 may be a layer of binary III-N compounds (AlN), ternary III-N compounds (AlGaN, InAlN, InGaN), or quaternary III-N compounds (InAlGaN). The ISL 122 serves as a spacer layer for confining electrons in the lower channel layer 121 and enhancing the electron mobility. The ISL 122 has a bandgap wider than that of the lower channel layer 121 and the upper channel layer 123. In certain embodiments, the thickness of the ISL 122 ranges 0.5 nm to 2 nm. As an example, the thickness of the ISL 122 is 1 nm.

The upper channel layer 123 is formed on and positioned above the ISL 122. The upper channel layer 123 also forms a conductive channel for the HEMT device 100 by providing a path for electrons to flow from the source electrode 111 to the drain electrode 113 with a detour in electron trajectories from the upper channel layer 123 to the lower channel layer 121, then back to the upper channel layer 123. In certain embodiments, the upper channel layer 123 is selected from the group consisting GaN, InN, and their alloys. In certain embodiments, the thickness of the upper channel layer 123 ranges 2 nm to 10 nm. As an example, the thickness of the upper channel layer 123 is 6 nm.

The IEL 124 is formed on and positioned above the upper channel layer 123. The IEL 124 may be a layer of binary III-N compounds (AlN), ternary III-N compounds (AlGaN, InAlN, InGaN), or quaternary III-N compounds (InAlGaN). The IEL 124 serves as a spacer layer for confining the electrons in the upper channel layer 123 and enhancing the electron mobility. The IEL 124 has a bandgap wider than that of the lower channel layer 121, the upper channel layer 123 and the barrier layer 125. In certain embodiments, the thickness of the IEL 124 ranges 0.5 nm to 2 nm. As an example, the thickness of the IEL 124 is 1 nm.

The barrier layer 125 is formed on and positioned above the IEL 124. The barrier layer 125 may be a layer of binary III-N compounds (AlN), ternary III-N compounds (AlGaN, InAlN, InGaN), or quaternary III-N compounds (InAlGaN). The barrier layer 125 is undoped. The barrier layer 125 has a bandgap wider than that of the lower channel layer 121 and the upper channel layer 123. In certain embodiments, the thickness of the barrier layer 125 ranges 10 nm to 20 nm. As an example, the thickness of the barrier layer 125 is 13.5 nm.

As explained above, the ISL 122 is formed above the lower channel layer 121 to create a first wide bandgap heterojunction between the lower channel layer 121 and the ISL 122. With the wide bandgap heterostructure, a first 2 DEG channel 121A with high electron mobility is generated and formed in the lower channel layer 121 near a first interface between the lower channel layer 121 interfacing with the ISL 122.

Similarly, the IEL 124 is formed above the upper channel layer 123 to create a second wide bandgap heterojunction between the upper channel layer 123 and the IEL 124. With the wide bandgap heterostructure, a second 2 DEG channel 123A with high electron mobility is generated and formed in the upper channel layer 123 near a second interface between the upper channel layer 123 interfacing with the IEL 124.

Figure 4:
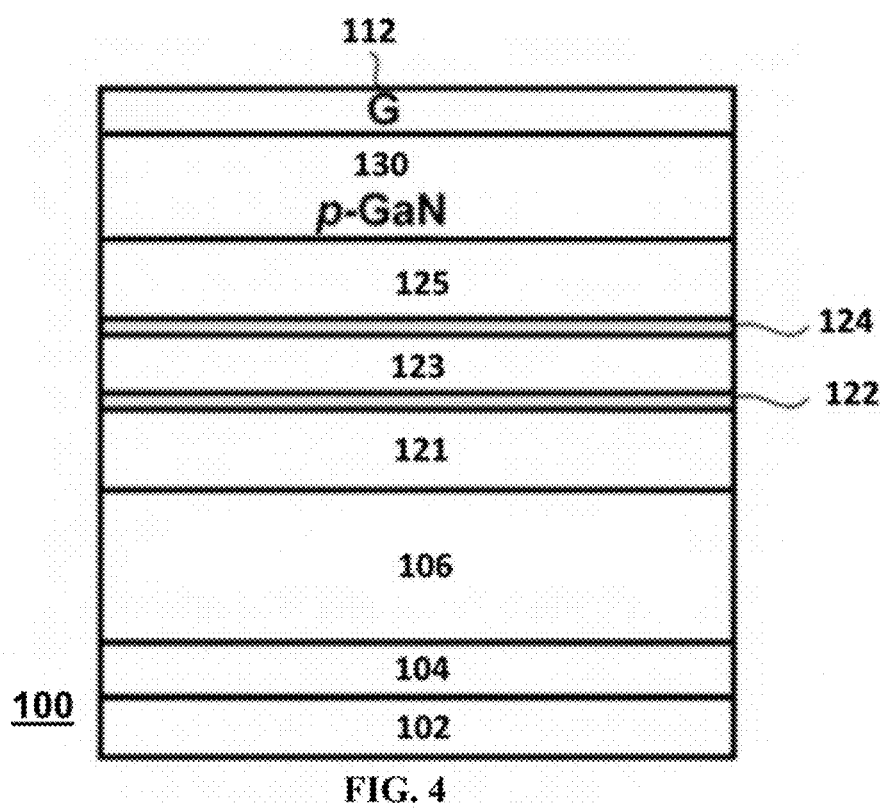
FIG. 4 is a side view of the p-GaN gate double channel HEMT of FIG. 3 along the gate terminal.

Above the barrier layer 125, the source electrode 111, the gate electrode 112, and the drain electrode 113 are provided for forming a transistor device. In certain embodiments, the source, gate, and drain electrodes 111-113 are ohmic contacts or Schottky contacts. FIG. 4 shows the side view of the HEMT device 100 along the gate terminal 112.

The transistor device can be switched between ON or OFF by controlling the gate electrode 112. To realize a normally-off operation, the p-type cap 130 is provided between the gate electrode 112 and the barrier layer 125. Other methods to realize a normally-off operation in the HEMT device 100, such as fluorine ion implantation technique, recessed gate structure with or without the gate dielectric, etc., may instead be adopted without departing from the scope and spirit of the present disclosure. In certain embodiments, the p-type cap 130 is a layer of binary III-N compounds (AlN, GaN, InN), ternary III-N compounds (AlGaN, InAlN, InGaN), or quaternary III-N compounds (InAlGaN), without a recess-etching into the barrier layer 125. Therefore, the HEMT device 100 without a recess-etching has a planar top p-GaN gate with a pristine upper channel layer 123, which is compatible with the p-GaN technology.

The source electrode 111 and the drain electrode 113 are formed on and positioned above the barrier layer 125. The gate electrode 112 is formed on and positioned above the p-type cap 130. In one embodiment, the source electrode 111 is connected to a low potential terminal; and the drain electrode 113 is connected to a high potential (input) terminal. A passivation layer 114 is formed on the semiconductor stack of the HEMT device 100 and particularly provided above the barrier layer 125 separating the source electrode 111, the gate electrode 112, and the drain electrode 113. The passivation layer 114 may be a single layer or a stack of dielectric layers. As an example, the passivation layer 114 may be formed as dielectric stakes selected from AlN/SiN$_x$, AlN/SiO$_2$, SiN$_x$/SiO$_2$, etc.

Figure 5:
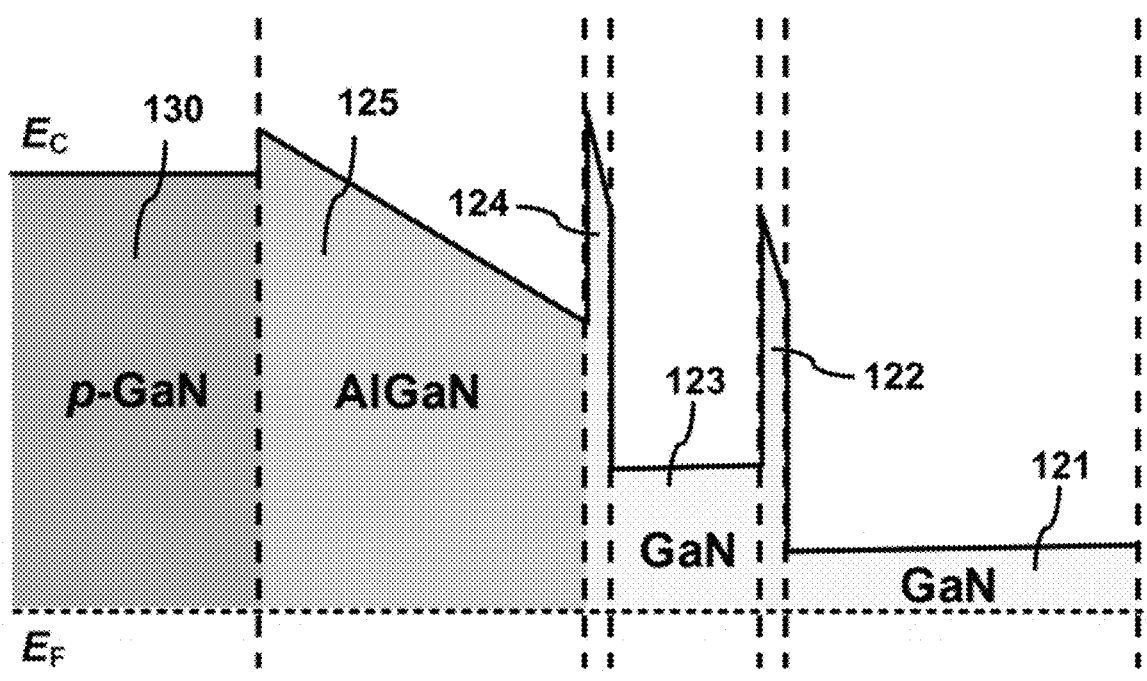
FIG. 5 is an energy band diagram at $V_{GS}$=0V of the p-GaN gate double channel HEMT of FIG. 3.

In order to effectively suppress hot electron induced dynamic Ron degradation, the HEMT device 100 advantageously includes a double channel structure provided by the lower channel layer 121 and the upper channel layer 123. FIG. 5 shows the energy band diagram at V$_{GS}$=0V of the HEMT device 100 according to an exemplary embodiment. The reference marks E$_C$ and E$_F$ denote the energy level of a conduction band and the Fermi energy level respectively.

The ISL 122 and the IEL 124 each provides a higher energy band with a potential barrier with respect to the electrons generated between the ISL 122 and the lower channel layer 121, and between the IEL 124 and the upper channel layer 123. The potential barrier may prevent or reduce a flow of hot electrons moving from the lower channel layer 121 to the barrier layer 125. As it is provided that hot electrons are generated in the first 2 DEG channel 121A and the second 2 DEG channel 123A. When the device is hard-switched ($V_{GS}$>$V_{TH}$), the hot electrons are scattered away by the potential barriers provided by the ISL 122 and the IEL 124. Therefore, the hot electrons would not be redirected toward the critical yet vulnerable interface between the passivation layer 114 and the barrier layer 125. As a result, the HEMT device 100 is free of hot electronics induced dynamic Ron degradation.

The method for fabricating the p-GaN gate double channel HEMT device 100 of the present disclosure is described herein. FIGS. 6A-6G show various stages of an exemplary fabrication process of the HEMT device 100, which has an III-N semiconductor stack with a double channel architecture. FIG. 7 provides a flow diagram summarizing an exemplary fabrication process.

Figures 6A, 6B:
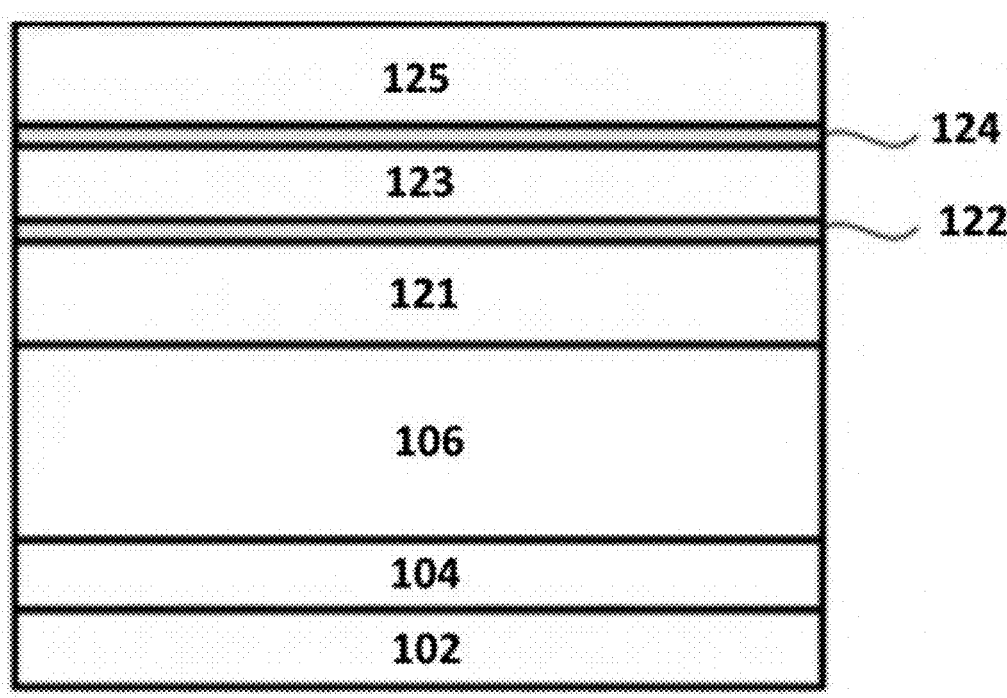
FIGS. 6A-6G show various stages of an exemplary fabrication process of the p-GaN gate double channel HEMT of FIG. 3, in accordance with certain embodiments of the present disclosure.

With reference to FIG. 6A, the first step S701 is to prepare the substrate 102, which can be made of silicon, sapphire, diamond, SiC, AlN, GaN, or the like. The substrate 102 is the backside of the HEMT device 100. The substrate 102 is cleaned, annealed, and prepared using standard semiconductor fabrication techniques, such as RCA cleaning, to remove any surface contaminants and provide a suitable surface for the growth of the subsequent layers.

The second step S702 is to deposit the nucleation layer 104, the buffer layer 106, the lower channel layer 121, the ISL 122, the upper channel layer 123, the IEL 124, the barrier layer 125, and a p-type layer 130A sequentially above the substrate 102 to form a semiconductor stack. FIG. 6B illustrates the forming of the p-type layer 130A (such as a p-GaN layer) on the barrier layer 125. In certain embodiments, each of the layers in the semiconductor stack can be deposited by metal-organic chemical vapor deposition (MOCVD), molecular beam epitaxy (MBE), hydride vapour phase epitaxy (HYPE), or other suitable deposition techniques. Optionally, the doping concentration of the p-type layer 130A can further be adjusted by various doping process.

In certain embodiments, the ISL 122, the IEL 124, and the barrier layer 125 are fabrication using material selected from binary III-N compounds (AlN), ternary III-N compounds (AlGaN, InAlN, InGaN), or quaternary III-N compounds (InAlGaN). In particular, for the case that the ISL 122, the IEL 124, and the barrier layer 125 are fabricated using AlN, the AlN is formed by MOCVD, MBE, HYPE, plasma-enhanced atomic layer deposition (PEALD) or thermal atomic layer deposition (TALD).

Figures 6C, 6D:
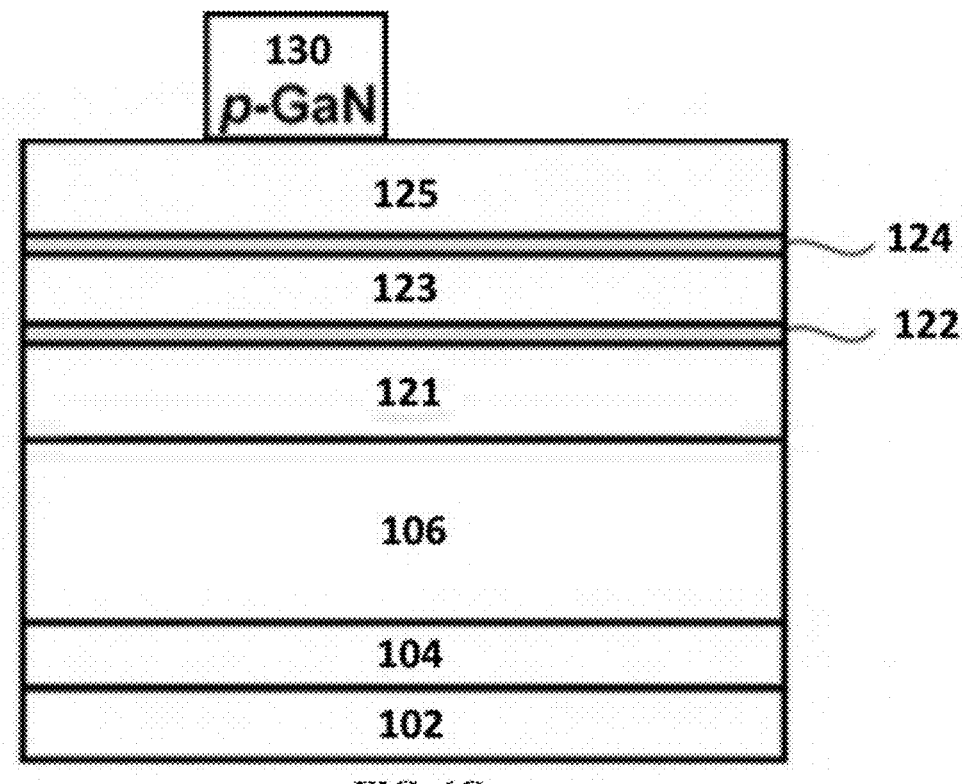

The third fourth step S703 is shown in FIG. 6C. Certain areas of the p-type layer 130A are removed to obtain a p-type cap 130 (such as a p-GaN cap). In particular, the p-type cap 130 shall cover at least the area of the gate electrode 112. The areas outside the gate electrode 112 are removed by plasma dry etching, digital etching, or a combination thereof. The etching shall not be extended to the barrier layer 125.

The fourth step S704 is shown in FIG. 6D. A passivation layer 114 is deposited at the top of the barrier layer 125 and the p-type cap 130. The passivation layer 114 may be made of dielectric materials such as $AlN/SiN_x$, $AlN/SiO_2$, $SiN_x$/ $SiO_2$, etc. The passivation layer 114 may be formed by plasma-enhanced chemical vapor deposition (PECVD) or low-pressure chemical vapor deposition (LPCVD).

Figures 6E, 6F:
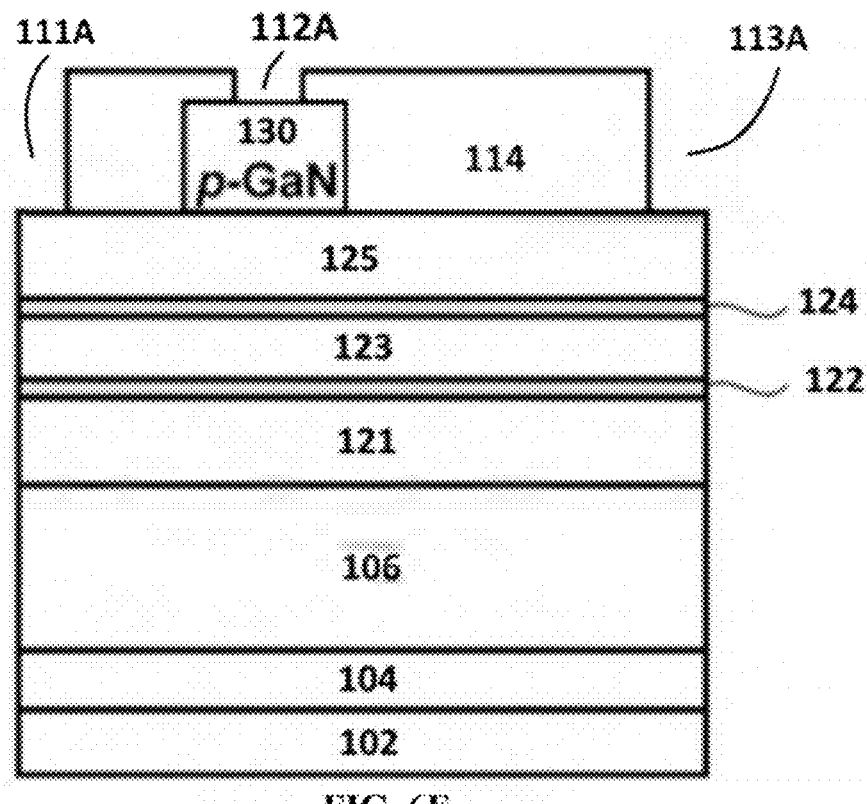

In the fifth step S705, a gate window 112A is created by performing etching from the passivation layer 114 at regions within the p-type cap 130, as shown in FIG. 6E. The gate window 112A is the position for depositing the gate electrode 112. A source window 111A and a drain window 113A are also created by performing etching from the passivation layer 114. In certain embodiments, the source window 111A and the drain window 113A are created on opposing sides of the barrier layer 125.

Figure 6G:
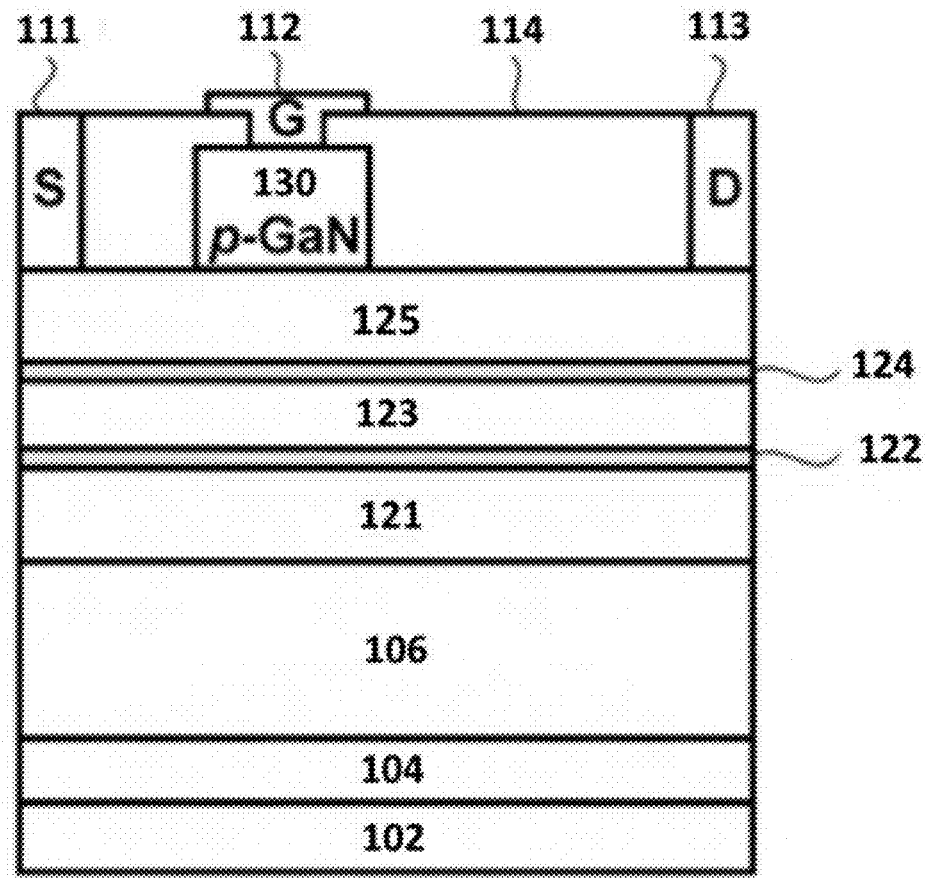

FIG. 6F shows the sixth step S706 and the seventh step S707 of the fabrication process. A plurality of ohmic contacts are deposited at the source window 111A, the drain window 113A, and the gate window 112A to form the source electrode 111 and the drain electrode 113 on the barrier layer 125, and the gate electrode 112 on the p-type cap 130. The resulting structure is shown in FIG. 6G. The final step S708 is to form pad metals for establishing connections to the source electrode 111, the gate electrode 112, and the drain electrode 113.

Figure 8:
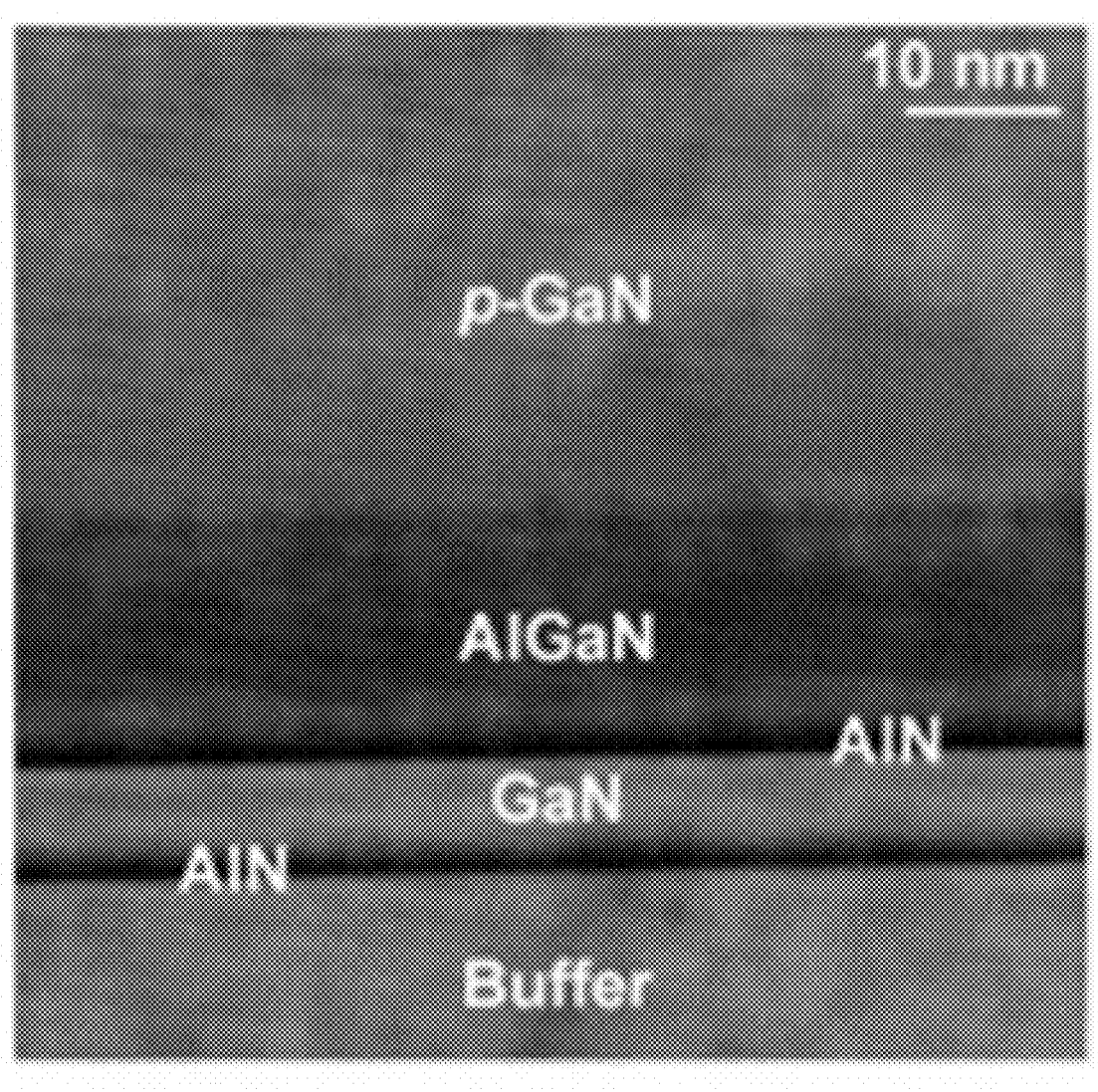
FIG. 8 is a cross-sectional image of an exemplary p-GaN gate double channel HEMT captured by a transmission electron microscope (TEM)

FIG. 8 is a cross-sectional image of an exemplary p-GaN gate double channel HEMT captured by a transmission electron microscope (TEM). In the illustrated embodiment, the buffer layer 106 is GaN and includes the lower channel layer 121 as indicated as "buffer" in the image. The ISL 122 and the IEL 124 are both AlN. The upper channel layer 123 is also GaN. On top of the IEL 124, a barrier layer 125 of AlGaN is provided.

Figure 9A:
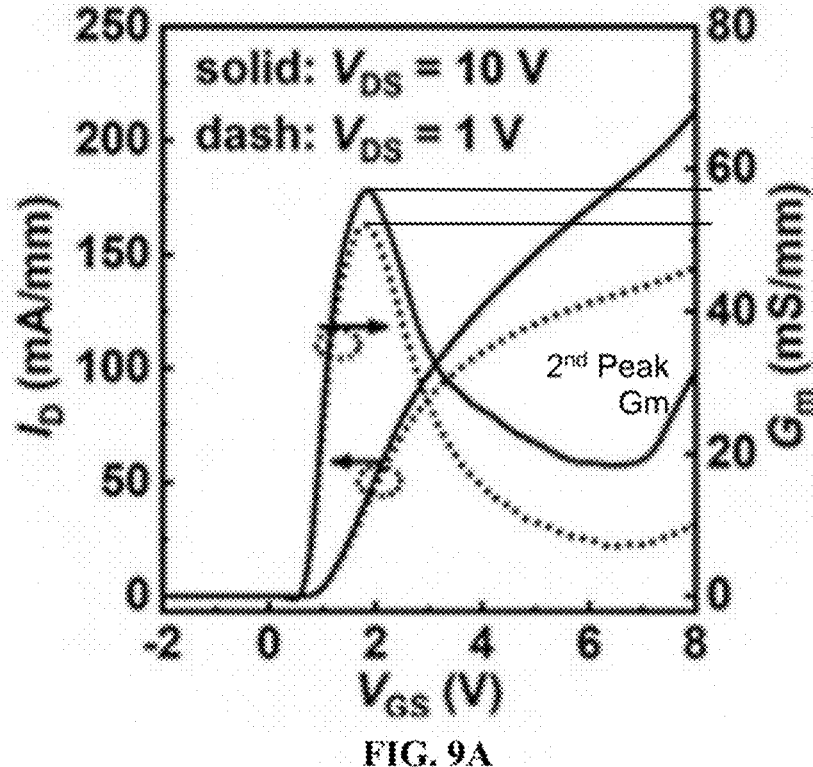
FIGS. 9A and 9B show the transfer characteristics graphs of an exemplary p-GaN gate double channel HEMT in linear scale and logarithmic scale.

FIG. 9A shows the transfer characteristics graph of an exemplary p-GaN gate double channel HEMT in linear scale. The graph shows that at a fixed drain-source voltage ($V_{DS}$) of 10V, the device exhibits a peak transconductance (Gm) of 58 mS/mm at a gate-source voltage ($V_{GS}$) of 1.8V. Similarly, at a lower $V_{DS}$ of 1V, the graph shows a peak Gm of 52 mS/mm, indicating that the performance is affected by $V_{DS}$. Additionally, a second peak in Gm is observed at high $V_{GS}$ values, which originates from hole injection. This second peak in Gm demonstrates the ability of the HEMT device 100 of the present disclosure in handling high $V_{GS}$ condition by delivering high performance with hole injection.

Figure 9B:
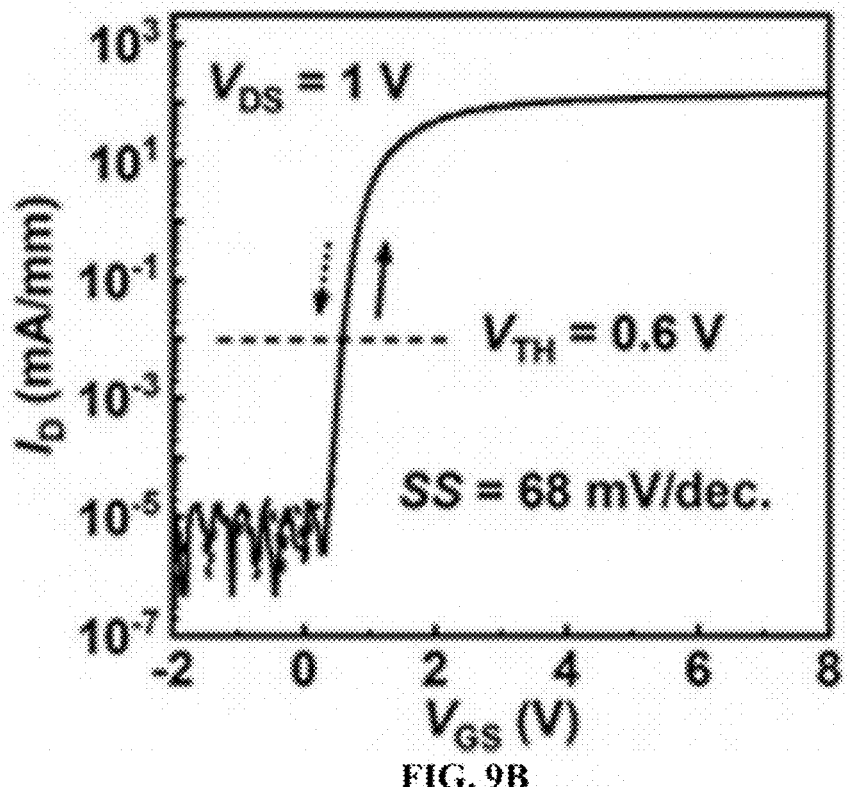

FIG. 9B shows the transfer characteristics graph in logarithmic scale. The graph shows that the HEMT device 100 operates in enhancement mode with a threshold voltage ($V_{TH}$) of 0.6 V at a drain current density of 10 μA/mm. When the drain-source voltage (V D s) is increased to 1V, the graph shows a saturation region where the drain current density remains nearly constant at a value of 100 mA/mm, indicating the ability of the HEMT device 100 to deliver a relatively constant current under varying gate-source voltages. The transfer characteristics graph also shows a subthreshold slope (SS) of 68 mV/dec in the linear region.

Figure 10A:
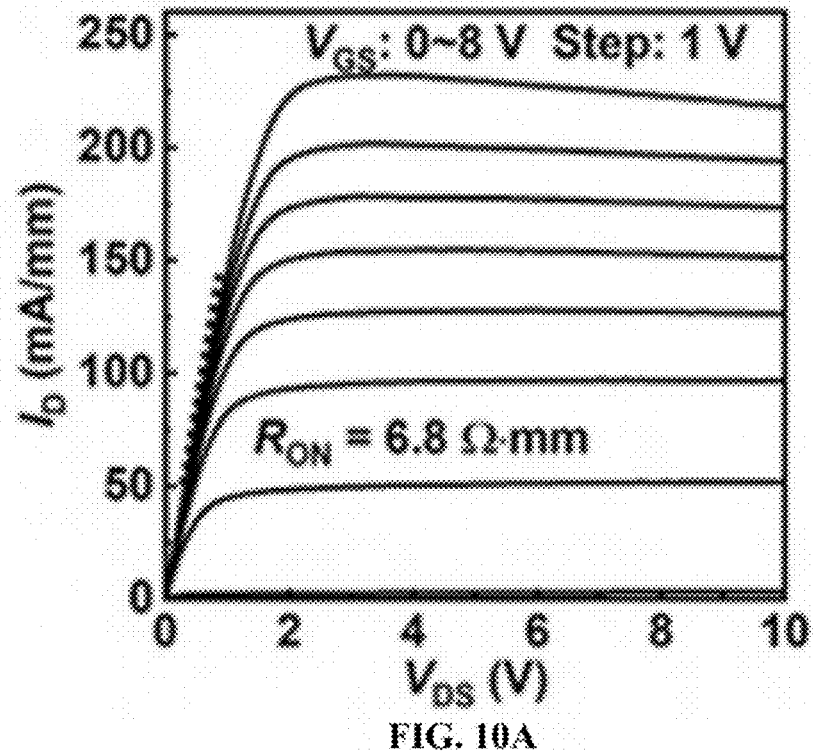
FIGS. 10A and 10B show the output characteristics and the OFF-state characteristics of an exemplary p-GaN gate double channel HEMT.

FIG. 10A shows the output characteristics of the HEMT device 100. The graph shows the relationship between the $V_{DS}$ and the drain current (I D) for various $V_{GS}$ ranging from 0V to 8V. As the $V_{GS}$ increases, $I_D$ also increases from approximately 50 mA/mm to 230 mA/mm, indicating the ability of the HEMT device 100 in handling high current densities. The graph also shows that the Ron is 6.8 Ωmm.

Figure 10B:
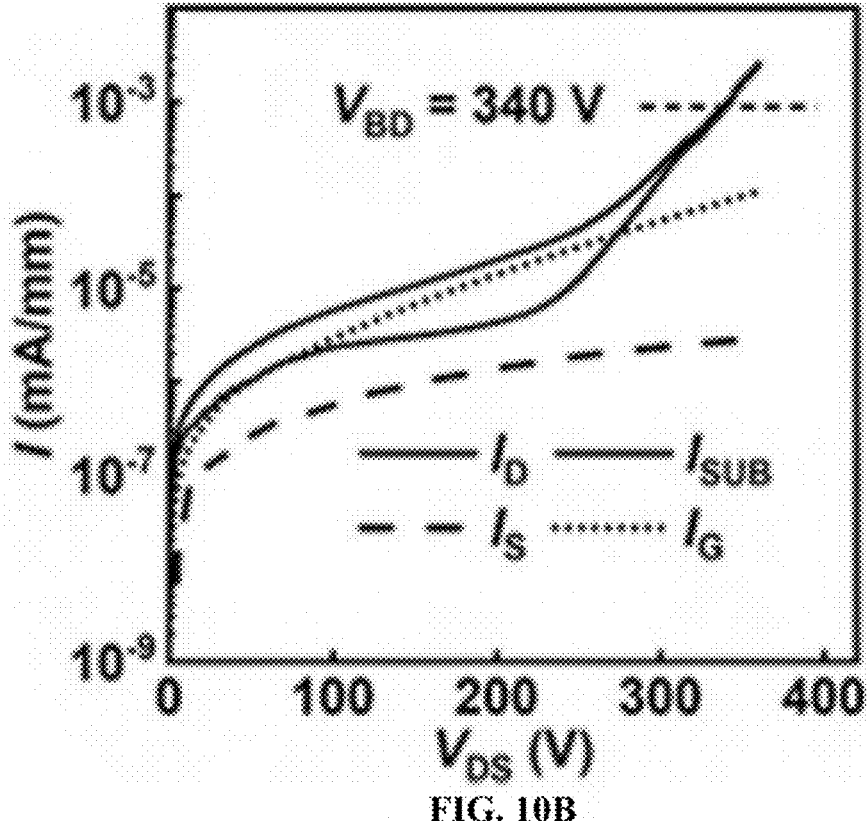

FIG. 10B shows the OFF-state characteristics of the HEMT device 100. The graph provides information with respect to the behavior of the HEMT device 100 when it is not conducting current. The relationship between $V_{DS}$ and the $I_D$ is shown. At a back-gate voltage ($V_{BD}$) of 340V, the graph indicates that the device has a very low OFF-state current of 1 uA/mm, demonstrating its ability to maintain a high level of insulation between the drain electrode 113 and the source electrode 111 even at high voltages.

Figure 11A:
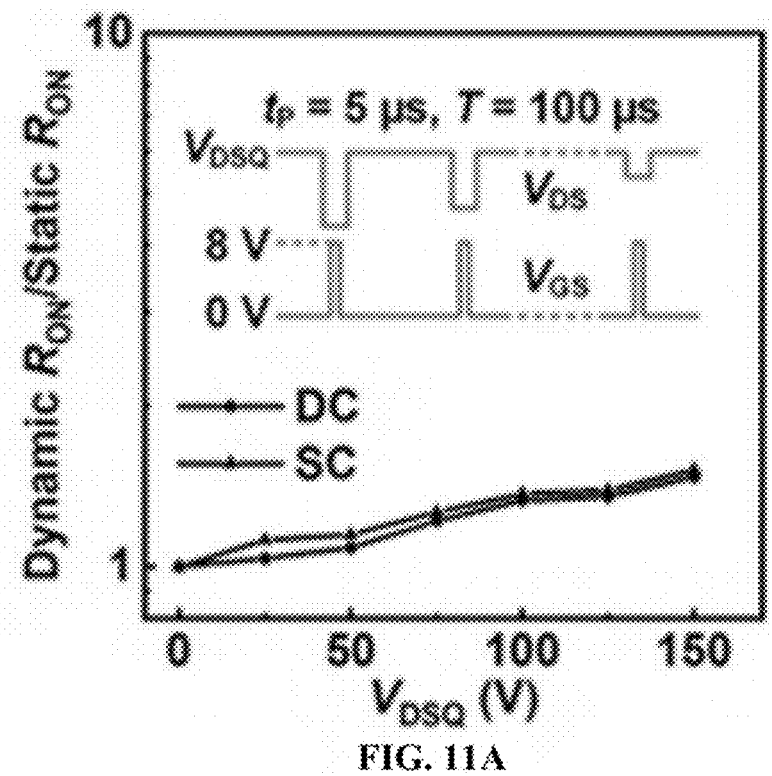
FIG. 11A shows the comparison of the normalized dynamic $R_{ON}$ of a fresh unstressed single channel HEMT device and a fresh unstressed double channel HEMT device.
Figure 11B:
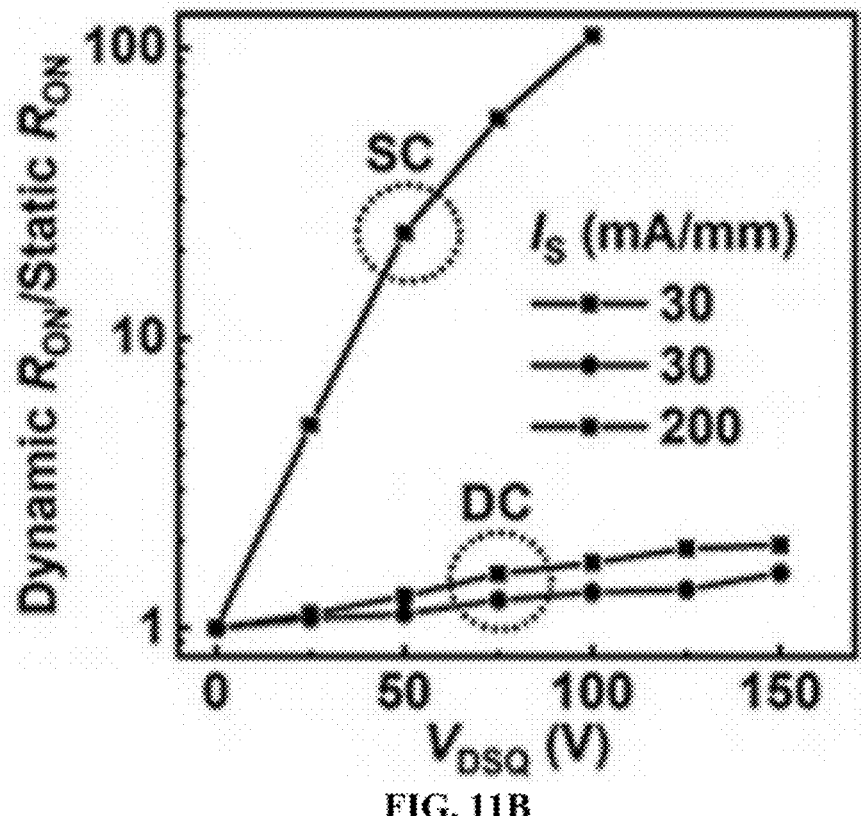
FIG. 11B shows the comparison of the normalized dynamic $R_{ON}$ of a stressed single channel HEMT device and a stressed double channel HEMT device.

FIG. 11A shows the comparison of the normalized dynamic $R_{ON}$ of a fresh unstressed single channel HEMT device and a fresh unstressed double channel HEMT device. The initial dynamic $R_{ON}$ performance for single channel and double channel are similar. When the device is hard-switched ($V_{GS}>V_{TH}$) and features a high $V_{DS}$ (e.g., 50 V for the HEMT device 100), hot electrons are generated in the 2 DEG channel resulting in elastic scattering of hot electrons. The normalized dynamic $R_{ON}$ of the stressed single channel HEMT device and the stress double channel HEMT device are compared in FIG. 11B. There is a significant dynamic $R_{ON}$ degradation in the single channel device after stress. This shows that the HEMT device 100 with a double channel architecture can effectively suppress the hot electron induced dynamic Ron degradation.

Figures 12A, 12B:
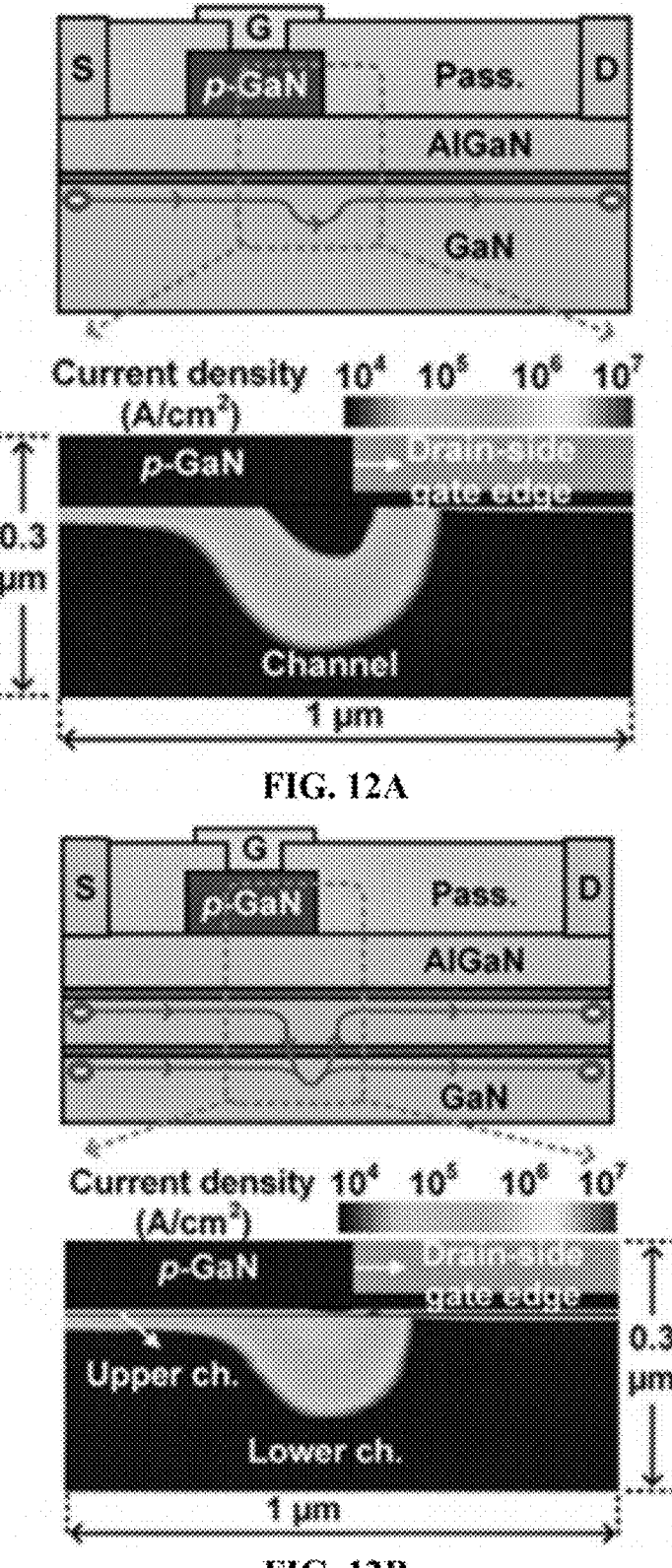
FIG. 12A shows the schematic electron trajectories and simulated current distributions in a single channel HEMT during semi-ON state.
FIG. 12B shows the schematic electron trajectories and simulated current distributions in a double channel HEMT during semi-ON state.

FIG. 12A shows the schematic electron trajectories and simulated current distributions in a single channel HEMT during semi-ON state. FIG. 12B shows the schematic electron trajectories and simulated current distributions in a double channel HEMT during semi-ON state. From the electron trajectories, the electrons detour from the upper channel layer 123 to the lower channel layer 121, then back to the upper channel layer 123. As the electron trajectories are affected by the presence of the gate electrode 112 that are positioned above the upper channel layer 123. At a source end of the upper channel layer 123, the electric field created by the gate electrode 112 repels electrons away from the upper channel layer 123, and flows towards the drain end of the upper channel layer 123. Meanwhile, at the drain end of the upper channel layer 123, the electric field created by the gate electrode 112 changes in direction, and attracts electrons towards the upper channel layer 123. The double channel architecture allows the detour of the electron trajectories from the upper channel layer 123 to the lower channel layer 121 at a drain end of the upper channel layer 123. Therefore, the hot electrons injection is reduced to improve the overall performance and reliability of the HEMT device 100.

Figure 13A:
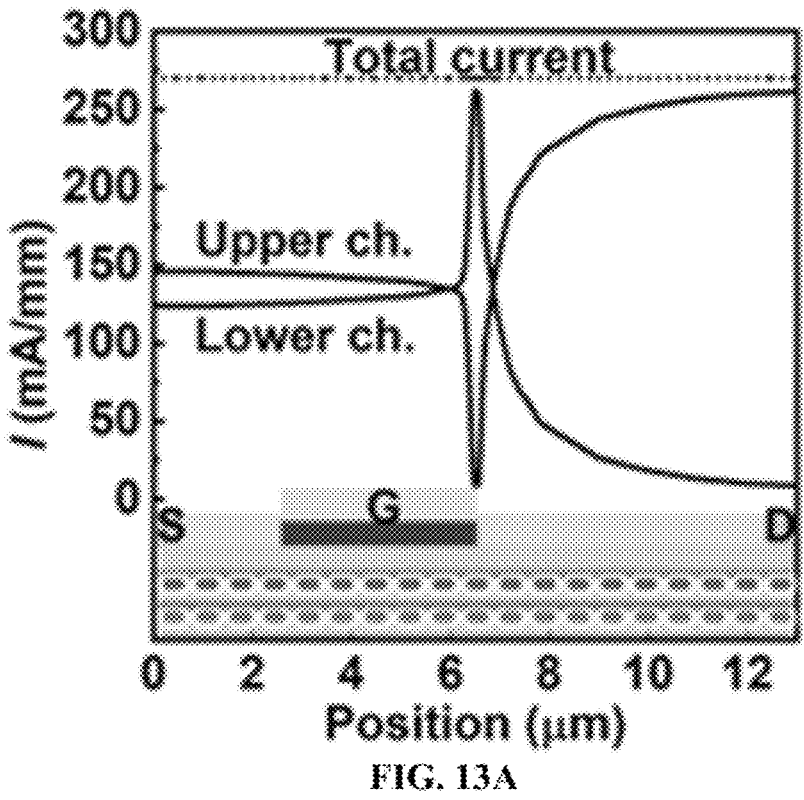
FIG. 13A shows the current distributions along two channels from the source electrode to the drain electrode in the double channel HEMT under hot electrons stress.
Figure 13B:
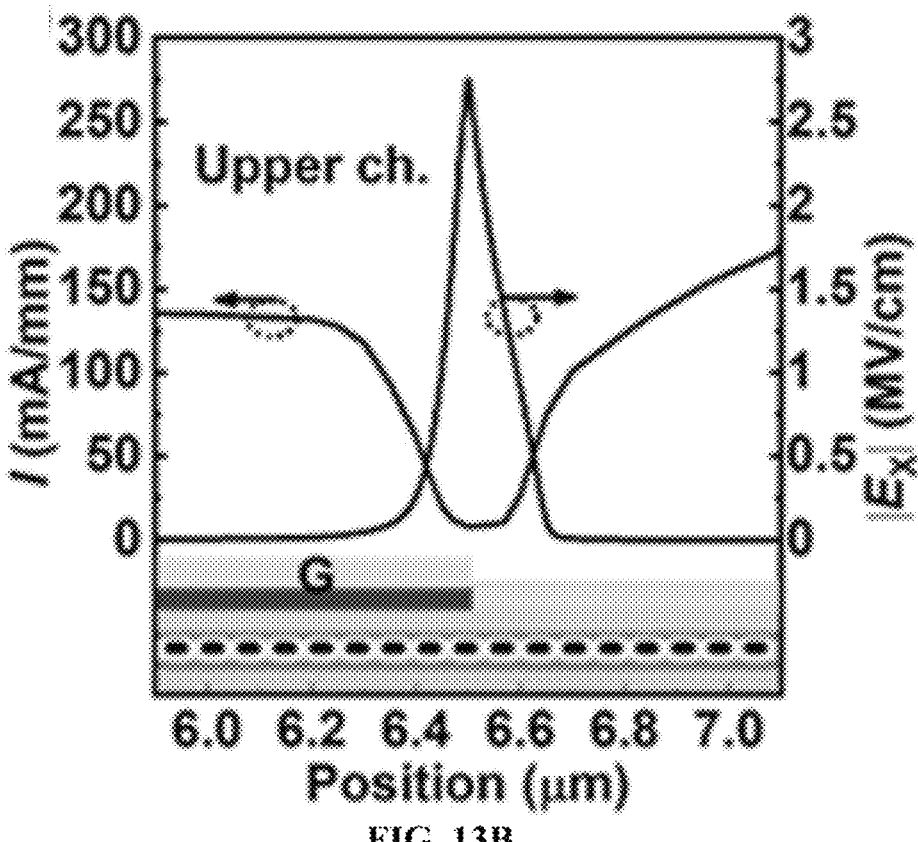
FIG. 13B shows the current and lateral E-field distribution along the upper channel near the drain-side gate corner in the double channel HEMT under hot electrons stress.

The current distributions of the upper channel layer 123 and the lower channel layer 121 under hot electrons stress are shown in FIG. 13A to illustrate the advantages of the HEMT device 100 in accordance with the present disclosure. The corresponding E-field distribution is also shown in FIG. 13B. Most hot electrons are generated in the lower channel layer 121. Extra scattering by the AlN of the ISL 122 and the GaN (the lower channel layer 121) heterojunction could effectively de-energize the generated hot electrons, and redirect them away from the critical interface.

This illustrates a normally-off p-GaN gate double channel HEMT in accordance with the present disclosure. It will be apparent that variants of the above-disclosed and other features and functions, or alternatives thereof, may be integrated into other semiconductor devices. The present embodiment is, therefore, to be considered in all respects as illustrative and not restrictive. The scope of the disclosure is indicated by the appended claims rather than by the preceding description, and all changes that come within the meaning and range of equivalency of the claims are therefore intended to be embraced therein.

LIST OF REFERENCES

There follows a list of references that are occasionally cited in the specification. Each of the disclosures of these references is incorporated by reference herein in its entirety.

[1] C. Hu, "Lucky-electron model of channel hot electron emission," in 1979 International Electron Devices Meeting, 1979, pp. 22-25, doi: 10.1109/IEDM.1979.189529.

[2] A. Sozza, C. Dua, E. Morvan, M. A. diForte-Poisson, S. Delage, F. Rampazzo, A. Tazzoli, F. Danesin, G. Meneghesso, E. Zanoni, A. Curutchet, N. Malbert, N. Labat, B. Grimbert, and J.-C. De Jaeger, "Evidence of traps creation in GaN/AlGaN/GaN HEMTs after a 3000 hour on-state and off-state hot-electron stress," in IEEE InternationalElectron Devices Meeting, 2005. IEDM Technical Digest., 2005, p. 4 pp.-593, doi: 10.1109/IEDM.2005.1609416.

[3] M. Ruzzarin, M. Meneghini, I. Rossetto, M. Van Hove, S. Stoffels, T.-L. Wu, S. Decoutere, G. Meneghesso, and E. Zanoni, "Evidence of Hot-Electron Degradation in GaN-Based MIS-HEMTs Submitted to High Temperature Constant Source Current Stress," IEEE Electron Device Letters, vol. 37, no. 11, pp. 1415-1417, November 2016, doi: 10.1109/LED.2016.2609098.

[4] S. Yang, Z. Zheng, L. Zhang, W. Song, and K. J. Chen, "GaN MIS-HEMTs with Surface Reinforcement for Suppressed Hot-Electron-Induced Degradation," IEEE Electron Device Letters, pp. 1-1, 2021, doi: 10.1109/LED.2021.3057933.

What is claimed is:

1. A high electron mobility transistor (HEMT) device capable of suppressing hot electron induced dynamic on-resistance (RON) degradation, comprising:

a substrate; and a semiconductor stack formed on the substrate, comprising:

a lower channel layer;

an insertion layer (ISL) positioned above the lower channel layer for confining electrons in the lower channel layer;

an upper channel layer formed on the ISL and contacting the ISL;

an interface enhancement layer (IEL) positioned above the upper channel layer for confining the electrons in the upper channel layer; and a barrier layer positioned above the IEL, wherein:

the ISL is formed above the lower channel layer to create a first wide bandgap heterojunction between the lower channel layer and the ISL;

the IEL is formed above the upper channel layer to create a second wide bandgap heterojunction between the upper channel layer and the IEL;

the ISL and the IEL each provides a higher energy band with a potential barrier with respect to the electrons generated between the ISL and the lower channel layer, and between the IEL and the upper channel layer; and the potential barrier prevents or reduces a flow of hot electrons moving from the lower channel layer to the barrier layer, wherein the HEMT device further comprises a gate electrode, wherein the semiconductor stack further comprises a p-type cap that is sandwiched between the barrier layer and the gate electrode for realizing a normally-off operation, wherein the p-type cap is provided without a recess-etching into the barrier layer such that the HEMT device has a planar top p-GaN gate and the upper channel layer is a pristine upper channel layer;

wherein a thickness of the ISL layer and the IEL layer ranges between 0.5 nm to 2 nm.

2. The HEMT device of claim 1, wherein the lower channel layer is selected from a group consisting GaN, InN, and their alloys; and the ISL is a layer of binary III-N compounds (AlN), ternary III-N compounds (AlGaN, InAlN, InGaN), or quaternary III-N compounds (InAlGaN).

3. The HEMT device of claim 1, wherein the upper channel layer is selected from a group consisting GaN, InN, and their alloys; and the IEL is a layer of binary III-N compounds (AlN), ternary III-N compounds (AlGaN, InAlN, InGaN), or quaternary III-N compounds (InAlGaN).

4. The HEMT device of claim 1, wherein the barrier layer is a layer of binary III-N compounds (AlN), ternary III-N compounds (AlGaN, InAlN, InGaN), or quaternary III-N compounds (InAlGaN).

5. The HEMT device of claim 1, wherein the p-type cap is a layer of binary III-N compounds (AlN, GaN, InN), ternary III-N compounds (AlGaN, InAlN, InGaN), or quaternary III-N compounds (InAlGaN).

6. The HEMT device of claim 5, wherein the p-type cap is a p-gallium nitride (p-GaN) cap.

7. The HEMT device of claim 5, further comprising:
a plurality of ohmic contacts deposited above the barrier layer to form a source electrode and a drain electrode.

8. The HEMT device of claim 7, wherein a passivation layer is provided above the barrier layer separating the source electrode, the gate electrode, and the drain electrode, wherein the passivation layer is a single layer or a stack of layers selected from AlN/SiN$_x$, AlN/SiO$_2$, and SiNx/SiO$_2$.

9. The HEMT device of claim 7, wherein the upper channel layer forms a conductive channel for the HEMT device by providing a path for the electrons to flow from the source electrode to the drain electrode with a detour in electron trajectories from the upper channel layer to the lower channel layer, then back to the upper channel layer.

10. The HEMT device of claim 1, wherein the semiconductor stack further comprises a nucleation layer and a buffer layer, wherein the nucleation layer reduces a lattice mismatch between the substrate and the buffer layer; and the buffer layer isolates the nucleation layer from the lower channel layer.

11. The HEMT device of claim 10, wherein the nucleation layer is an III-N nucleation layer selected from a group consisting AlN, GaN, InN, and their alloys.

12. The HEMT device of claim 10, wherein the buffer layer is an III-N semiconductor layer selected from a group consisting AlN, GaN, InN, and their alloys.

13. A method for fabricating high electron mobility transistor (HEMT) device capable of suppressing hot electron induced dynamic on-resistance (RON) degradation, the method comprising:
preparing a substrate; and
forming a semiconductor stack on the substrate, wherein forming the semiconductor stack comprises:
forming a lower channel layer;
forming an insertion layer (ISL) above the lower channel layer for confining electrons in the lower channel layer, thereby to create a first wide bandgap heterojunction between the lower channel layer and the ISL;
forming an upper channel layer on the ISL, wherein the upper channel layer contacts the ISL;
forming an interface enhancement layer (IEL) above the upper channel layer for confining the electrons in the upper channel layer, thereby to create a second wide bandgap heterojunction between the upper channel layer and the IEL; and forming a barrier layer above the IEL,
wherein:
the ISL and the IEL each provides a higher energy band with a potential barrier with respect to the electrons generated between the ISL and the lower channel layer, and between the IEL and the upper channel layer; and
the potential barrier prevents or reduces a flow of hot electrons moving from the lower channel layer to the barrier layer:
wherein the method further comprises forming a gate electrode,
wherein forming the semiconductor stack further comprises: forming a p-type cap such that the p-type cap is sandwiched between the barrier layer and the gate electrode for realizing a normally-off operation,
wherein the p-type cap is provided without a recess-etching into the barrier layer such that the HEMT device has a planar top p-GaN gate and the upper channel layer is a pristine upper channel layer;
wherein a thickness of the ISL layer and the IEL layer ranges between 0.5 nm to 2 nm.

14. The method of claim 13, wherein the ISL, the IEL, and the barrier layer are fabricated using material selected from binary III-N compounds (AlN), ternary III-N compounds (AlGaN, InAlN, InGaN), or quaternary III-N compounds (InAlGaN).

15. The method of claim 13, wherein the ISL, the IEL, and the barrier layer are fabricated using AlN, wherein the AlN is formed by MOCVD, MBE, HVPE, plasma-enhanced atomic layer deposition (PEALD) or thermal atomic layer deposition (TALD).

16. The method of claim 13, wherein forming the p-type cap further comprises:
forming a p-type layer on the barrier layer by metal-organic chemical vapor deposition (MOCVD), molecular beam epitaxy (MBE), or hydride vapour phase epitaxy (HVPE); and
removing areas of the p-type layer to obtain the p-type cap by plasma dry etching, digital etching, or a combination thereof,
wherein the method further comprises:
depositing a passivation layer at the top of the barrier layer and the p-type cap;
performing etching from the passivation layer at regions within the p-type cap to create a gate window, and at two opposing sides of the barrier layer to create a source window and a drain window; and
depositing a plurality of ohmic contacts at the source window, the drain window, and the gate window to form a source electrode and a drain electrode on the barrier layer,
wherein the passivation layer is a single layer or a stack of layers selected from AlN/SiN$_x$, AlN/SiO$_2$, and SiNx/SiO$_2$.

17. The method of claim 16, wherein the passivation layer is formed by performing plasma-enhanced chemical vapor deposition (PECVD) or low-pressure chemical vapor deposition (LPCVD).

18. The method of claim 13, wherein the step of forming the semiconductor stack further comprises performing deposition by MOCVD, MBE, or HVPE.

19. The method of claim 13 further comprising the step of forming pad metals for establishing connections to the source electrode, the gate electrode, and the drain electrode.

* * * * *